United States Patent
Lee et al.

(10) Patent No.: US 11,569,239 B2
(45) Date of Patent: Jan. 31, 2023

(54) SEMICONDUCTOR MEMORY DEVICES

(71) Applicant: Samsung Electronics Co., Ltd., Suwon-si (KR)

(72) Inventors: Kiseok Lee, Hwaseong-si (KR); Bong-Soo Kim, Yongin-si (KR); Jiyoung Kim, Yongin-si (KR); Hui-Jung Kim, Seongnam-si (KR); Seokhan Park, Seongnam-si (KR); Hunkook Lee, Hwaseong-si (KR); Yoosang Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 17/126,195

(22) Filed: Dec. 18, 2020

(65) Prior Publication Data

US 2021/0143154 A1    May 13, 2021

Related U.S. Application Data

(63) Continuation of application No. 16/268,748, filed on Feb. 6, 2019, now Pat. No. 10,910,378.
(Continued)

(30) Foreign Application Priority Data

May 23, 2018    (KR) .................. 10-2018-0058523

(51) Int. Cl.
*H01L 27/108* (2006.01)
*H01L 23/528* (2006.01)
(Continued)

(52) U.S. Cl.
CPC ...... *H01L 27/10805* (2013.01); *H01L 23/528* (2013.01); *H01L 27/10897* (2013.01);
(Continued)

(58) Field of Classification Search
CPC .............. H01L 27/10805; H01L 23/58; H01L 23/5226; H01L 27/10897; H01L 28/60;
(Continued)

(56) References Cited

U.S. PATENT DOCUMENTS

| 5,994,746 A | 11/1999 | Reisinger et al. |
| 6,511,878 B1 | 1/2003 | Matsumura |

(Continued)

FOREIGN PATENT DOCUMENTS

KR    20120092483 A    8/2012

OTHER PUBLICATIONS

"European Search Report corresponding to EP19155115.9, dated Dec. 5, 2019 (16 pages)".
(Continued)

*Primary Examiner* — Dzung Tran
(74) *Attorney, Agent, or Firm* — Myers Bigel, P.A.

(57) ABSTRACT

Semiconductor memory devices may include first and second stacks on a substrate and first and second interconnection lines on the first and second stacks. Each of the first and second stacks may include semiconductor patterns vertically stacked on the substrate, conductive lines connected to the semiconductor patterns, respectively, and a gate electrode that is adjacent to the semiconductor patterns and extends in a vertical direction. The first stack may include a first conductive line and a first gate electrode, and the second stack may include a second conductive line and a second gate electrode. Lower surfaces of the first and second conductive lines may be coplanar. The first interconnection line may be electrically connected to at least one of the first and second conductive lines. The second interconnection line may be electrically connected to at least one of the first and second gate electrodes.

20 Claims, 24 Drawing Sheets

Related U.S. Application Data

(60) Provisional application No. 62/629,335, filed on Feb. 12, 2018.

(51) Int. Cl.
  *H01L 29/08* (2006.01)
  *H01L 29/165* (2006.01)
  *H01L 29/10* (2006.01)
  H01L 23/522 (2006.01)
  H01L 49/02 (2006.01)

(52) U.S. Cl.
  CPC ...... *H01L 29/0847* (2013.01); *H01L 29/1037* (2013.01); *H01L 29/165* (2013.01); *H01L 23/5226* (2013.01); *H01L 28/60* (2013.01)

(58) Field of Classification Search
  CPC  H01L 29/0847; H01L 29/1037; H01L 29/165
  USPC ........................................................ 257/329
  See application file for complete search history.

(56) References Cited

U.S. PATENT DOCUMENTS

| | | | |
|---|---|---|---|
| 8,357,964 B1 | 1/2013 | Chen et al. | |
| 8,902,663 B1 | 12/2014 | Or-Bach et al. | |
| 9,023,723 B2 | 5/2015 | Chang et al. | |
| 9,806,082 B2 | 10/2017 | Tanaka et al. | |
| 2004/0140501 A1 | 7/2004 | Kim | |
| 2005/0275006 A1 | 12/2005 | Tang | |
| 2006/0289932 A1 | 12/2006 | Ahn et al. | |
| 2010/0140666 A1* | 6/2010 | Yoon ................... | H01L 27/0207 257/210 |
| 2010/0232200 A1 | 9/2010 | Shepard | |
| 2012/0231619 A1 | 9/2012 | Park et al. | |
| 2014/0054538 A1 | 2/2014 | Kyun | |
| 2015/0014760 A1 | 1/2015 | Bateman | |
| 2015/0019802 A1 | 1/2015 | Kamal et al. | |
| 2015/0054090 A1 | 2/2015 | Or-Bach et al. | |
| 2016/0268290 A1* | 9/2016 | Matsunaga ....... | H01L 27/11582 |
| 2017/0053906 A1 | 2/2017 | Or-Bach et al. | |
| 2017/0117291 A1 | 4/2017 | Or-Bach et al. | |
| 2017/0236830 A1* | 8/2017 | Inatsuka ............ | H01L 27/11548 257/620 |
| 2017/0271341 A1* | 9/2017 | Tanaka ................ | G11C 11/4094 |
| 2017/0278858 A1 | 9/2017 | Walker et al. | |
| 2018/0082750 A1* | 3/2018 | Ikeda .................. | H01L 27/1157 |

OTHER PUBLICATIONS

"European Search Report corresponding to European Patent Application No. 19155115.9, dated Jul. 22, 2019 (16 pages)".

* cited by examiner

SEMICONDUCTOR MEMORY DEVICES

CROSS-REFERENCE TO RELATED APPLICATION

This application is a continuation of U.S. patent application Ser. No. 16/268,748, filed Feb. 6, 2019, which claims priority under 35 U.S.C. § 119 to Korean Patent Application No. 10-2018-0058523, filed on May 23, 2018, and U.S. Provisional Patent Application 62/629,335, filed on Feb. 12, 2018, the entire contents of which are hereby incorporated by reference.

BACKGROUND

The present disclosure generally relates to a semiconductor device, and more particularly, to a highly-integrated three-dimensional semiconductor memory device.

Higher integration of semiconductor devices may be beneficial to meet consumer demand for superior performance and lower price. In the case of two-dimensional or planar semiconductor devices, since a level of integration may be determined by the area occupied by a unit memory cell, a level of integration may depend on patterning technologies. To form fine patterns, expensive process equipment may be used and thus increasing a level of integration for two-dimensional or planar semiconductor devices may be limited. To further increase a level of integration of semiconductor devices, three-dimensional semiconductor memory devices have been suggested.

SUMMARY

Some embodiments of the inventive concept provide a three-dimensional semiconductor memory device with a high integration density.

According to some embodiments of the inventive concept, semiconductor memory devices may include first and second interconnection lines on a substrate and first and second stacks between the substrate and the first and second interconnection lines. Each of the first and second stacks may include a plurality of semiconductor patterns vertically stacked on the substrate, a plurality of conductive lines connected to the plurality of semiconductor patterns, respectively, and a gate electrode that is adjacent to the plurality of semiconductor patterns and may extend in a vertical direction. Each of the plurality of conductive lines may extend in a first horizontal direction. The plurality of conductive lines of the first stack may include a first conductive line, and the plurality of conductive lines of the second stack may include a second conductive line, and a lower surface of the first conductive line may be at a level equal to a level of a lower surface of the second conductive line. The first interconnection line may be electrically connected to at least one of the first and second conductive lines. The gate electrode of the first stack may include a first gate electrode, the gate electrode of the second stack may include a second gate electrode, and the second interconnection line may be electrically connected to at least one of the first and second gate electrodes.

According to some embodiments of the inventive concept, semiconductor memory devices may include a substrate including a cell region and a contact region and a plurality of semiconductor patterns vertically stacked on the cell region. Each of the plurality of semiconductor patterns may include a first impurity region, a second impurity region, and a channel region between the first and second impurity regions. The semiconductor memory devices may also include a plurality of first conductive lines horizontally extending from the cell region onto the contact region, a plurality of capacitors, and a plurality of contacts contacting the plurality of first conductive lines, respectively, on the contact region. Each of the plurality of first conductive lines may be connected to a respective one of the first impurity regions of the plurality of semiconductor patterns. Each of the plurality of capacitors may be connected to a respective one of the second impurity regions of the plurality of semiconductor patterns. The plurality of contacts may include a first contact and a second contact that is closer to the cell region than the first contact, and a level of a bottom surface of the second contact is higher than a level of a bottom surface of the first contact.

According to some embodiments of the inventive concept, semiconductor memory devices may include a substrate including a cell region and a contact region, a first stack and a second stack on the substrate, and a first interconnection line and a second interconnection line on the first and second stacks. The first interconnection line may extend in a first horizontal direction that is parallel to a top surface of the substrate. The second interconnection line may extend in a second horizontal direction that crosses the first horizontal direction and is parallel to the top surface of the substrate. Each of the first and second stacks may include a plurality of memory cell transistors three-dimensionally arranged on the substrate, a bit line connected to first ones of the plurality of memory cell transistors, which are spaced apart from each other in the first horizontal direction, and a word line connected to second ones of the plurality of memory cell transistors, which are spaced apart from each other in a vertical direction that is perpendicular to the top surface of the substrate. The bit line of the first stack may include a first bit line, the bit line of the second stack may include a second bit line, and wherein, on the contact region, the first interconnection line may be electrically connected to at least one of the first and second bit lines. The word line of the first stack may include a first word line, the word line of the second stack may include a second word line, and wherein, on the cell region, the second interconnection line may be electrically connected to at least one of the first and second word lines.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods and structures. These drawings are not, however, to scale and may not precisely reflect the precise structural characteristics of any given embodiment, and should not be interpreted as defining or limiting example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
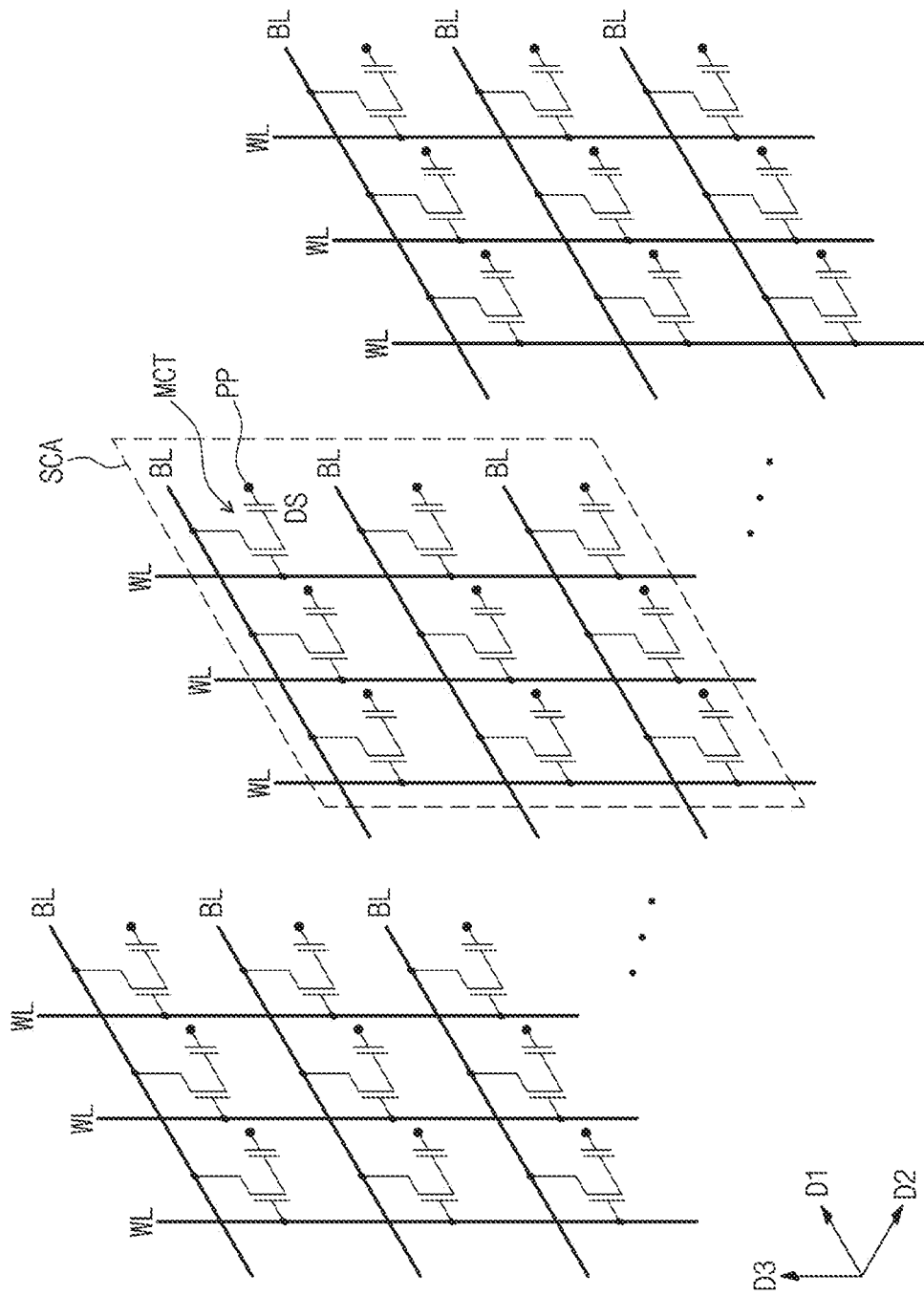
FIG. 1 is a circuit diagram schematically illustrating a cell array of a three-dimensional semiconductor memory device according to an embodiment of the inventive concept.

FIG. 1 is a circuit diagram schematically illustrating a cell array of a three-dimensional semiconductor memory device according to an embodiment of the inventive concept.

Referring to FIG. 1, a cell array of a three-dimensional semiconductor memory device according to an embodiment of the inventive concept may include a plurality of sub-cell arrays SCA. The sub-cell arrays SCA may be arranged in a second direction D2. In some embodiments, the sub-cell arrays SCA may be spaced apart from each other in the second direction D2.

Each of the sub-cell arrays SCA may include a plurality of bit lines BL, a plurality of word lines WL, and a plurality of memory cell transistors MCT. Each of the memory cell transistors MCT may be placed between a corresponding one of the word lines WL and a corresponding one of the bit lines BL. Although FIG. 1 shows that each of the sub-cell arrays SCA includes three word lines WL and three bit lines BL, it will be understand that each of the sub-cell arrays SCA can include more word lines WL and bit lines BL.

The bit lines BL may be conductive patterns (e.g., metal lines), which are spaced apart from, or stacked on, a substrate. The bit lines BL may be extended in a first direction D1. The bit lines BL in each of the sub-cell arrays SCA may be spaced apart from each other in a vertical direction (e.g., a third direction D3).

The word lines WL may be conductive patterns (e.g., metal lines) extending from the substrate in the vertical direction (e.g., in the third direction D3). The word lines WL in each of the sub-cell arrays SCA may be spaced apart from each other in the first direction D1.

A gate electrode of the memory cell transistor MCT may be connected to the word line WL, and a source electrode of the memory cell transistor MCT may be connected to the bit line BL. Each of the memory cell transistors MCT may include a data storing element DS. For example, the data storing element DS may be a capacitor, and a drain electrode of the memory cell transistor MCT may be connected to a first electrode of the capacitor. A second electrode of the capacitor may be connected to a ground line PP.

Figure 2:
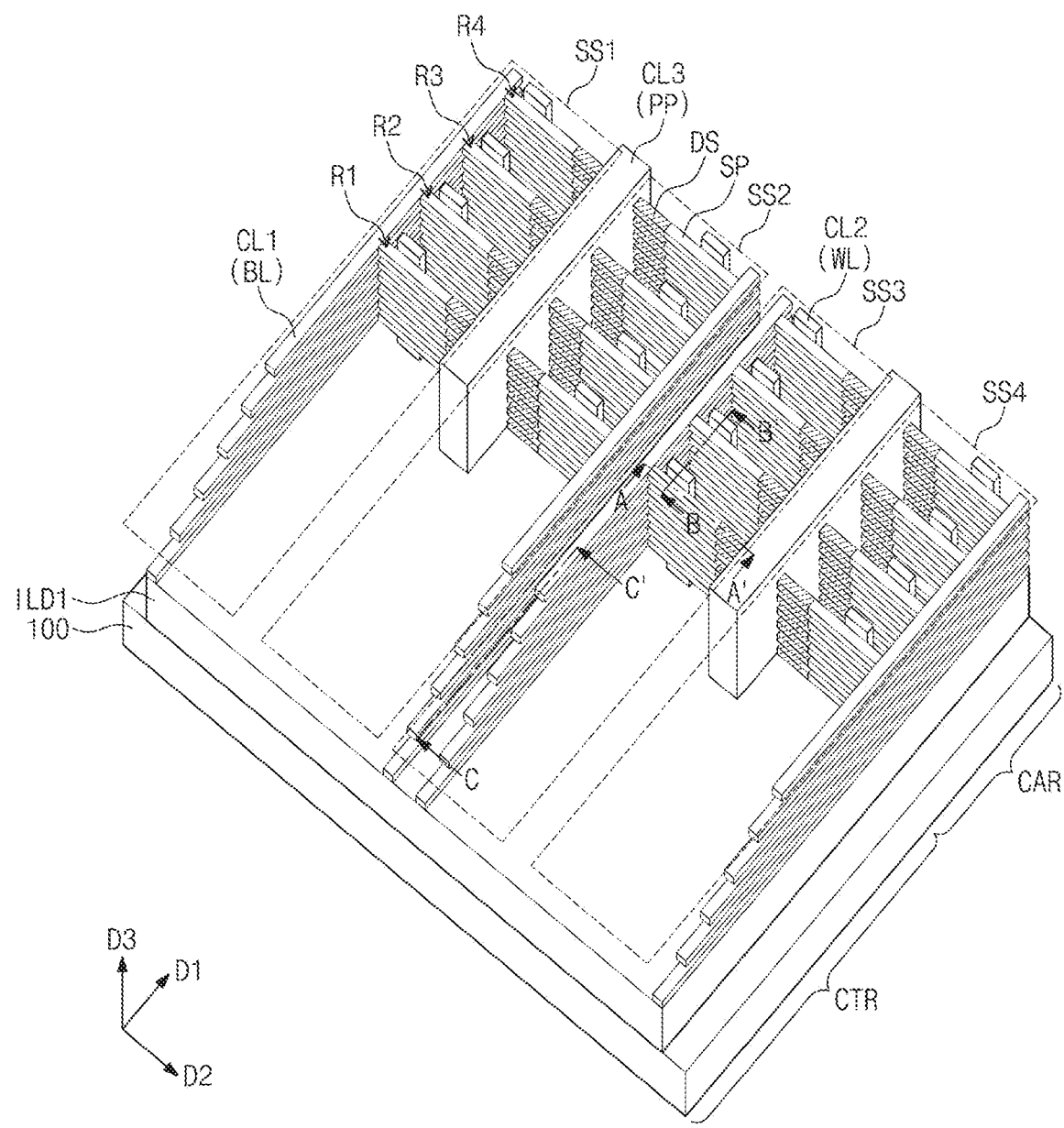
FIG. 2 is a perspective view illustrating a three-dimensional semiconductor memory device according to an embodiment of the inventive concept.
Figure 3A:
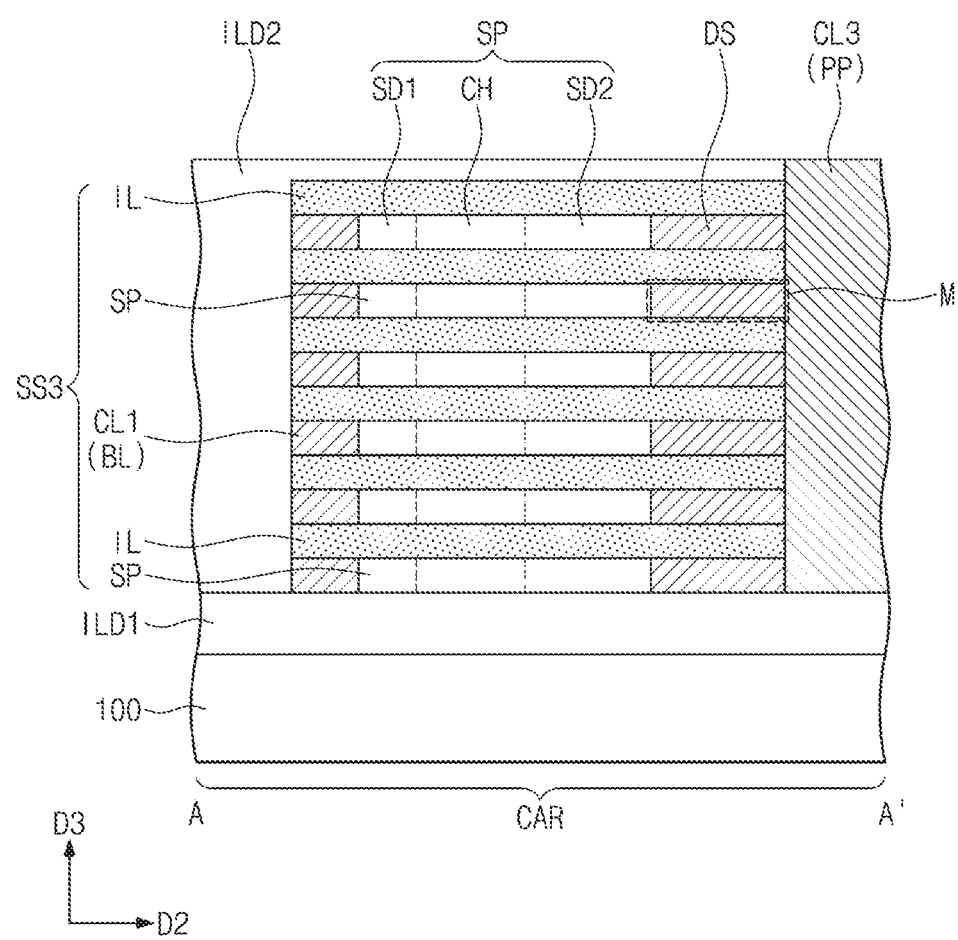
FIGS. 3A, 3B, and 3C are cross-sectional views taken along lines A-A', B-B', and C-C', respectively, of FIG. 2.
Figure 3B:
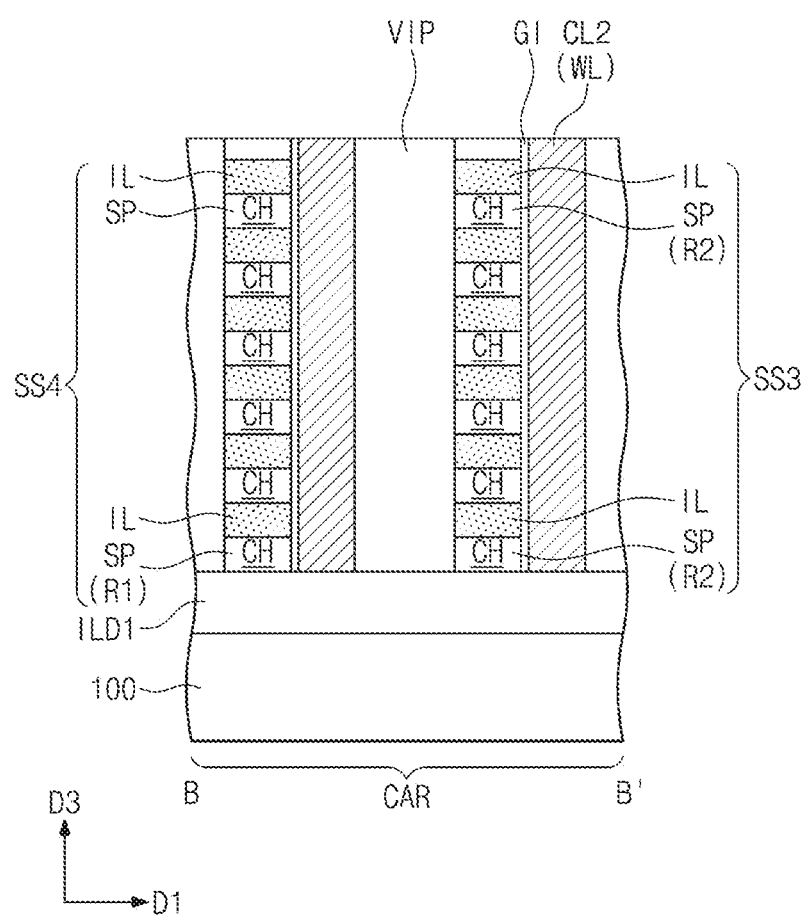
Figure 3C:
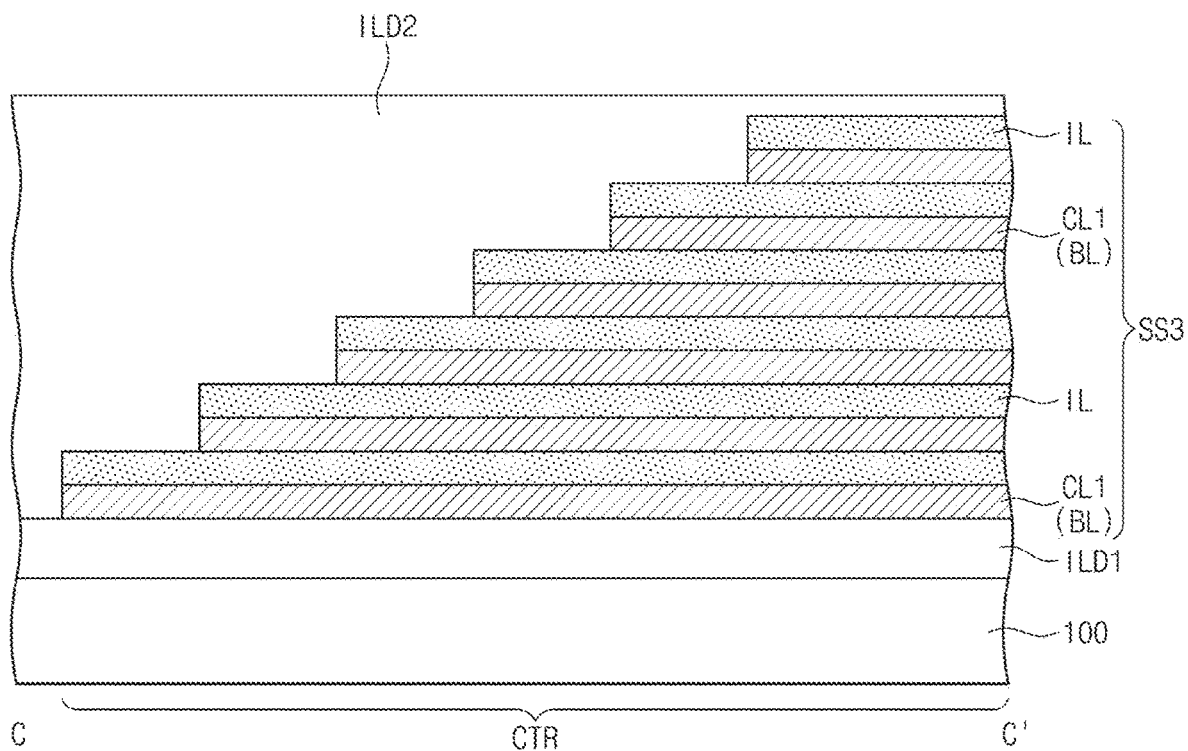
Figure 3D:
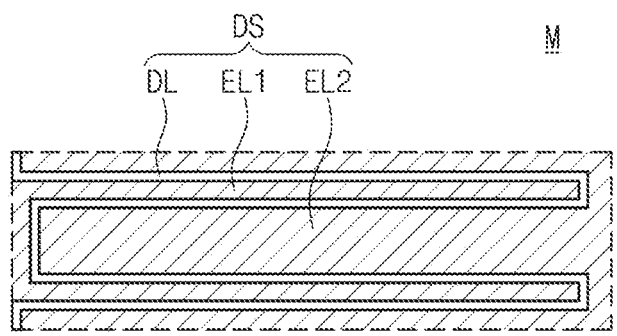
FIG. 3D is an enlarged cross-sectional view of a region 'M' of FIG. 3A.

FIG. 2 is a perspective view illustrating a three-dimensional semiconductor memory device according to an embodiment of the inventive concept. FIGS. 3A, 3B, and 3C are cross-sectional views taken along lines A-A', B-B', and C-C', respectively, of FIG. 2. FIG. 3D is an enlarged cross-sectional view of a region 'M' of FIG. 3A.

Referring to FIGS. 1, 2, and 3A to 3D, a substrate 100 including a cell region CAR and a contact region CTR may be provided. A first interlayered insulating layer ILD1 may be provided on the substrate 100. The substrate 100 may be, for example, a silicon wafer, a germanium wafer, or a silicon-germanium wafer.

First to fourth stacks SS1, SS2, SS3, and SS4 may be provided on the substrate 100. The first to fourth stacks SS1-SS4 may be vertically spaced apart from the substrate 100 with the first interlayered insulating layer ILD1 interposed therebetween. In some embodiments, the first to fourth stacks SS1-SS4 may extend in the first direction D1 and may be parallel to each other, as illustrated in FIG. 2. In some embodiments, each of the first to fourth stacks SS1-SS4 may extend longitudinally in the first direction D1. The first to fourth stacks SS1-SS4 may be arranged in the second direction D2 and thus may be spaced apart from each other in the second direction D2. Each of the first to fourth stacks SS1-SS4 may include the sub-cell array SCA previously described with reference to FIG. 1.

Each of the first to fourth stacks SS1-SS4 may include semiconductor patterns SP and insulating layers IL, which are alternatingly stacked on the first interlayered insulating layer ILD1. In each of the first to fourth stacks SS1-SS4, the semiconductor patterns SP may be vertically spaced apart from each other by the insulating layers IL. Each of the insulating layers IL may be interposed between each vertically adjacent pair of the semiconductor patterns SP. The insulating layers IL may be formed of or include at least one of silicon oxide, silicon nitride, silicon oxynitride, carbon-containing silicon oxide, carbon-containing silicon nitride, or carbon-containing silicon oxynitride.

In some embodiments, each of the semiconductor patterns SP may be a line-shaped, bar-shaped, or pillar-shaped pattern extending in the second direction D2, as illustrated in FIG. 2. Each of the semiconductor patterns SP may extend longitudinally in the second direction D2, as illustrated in FIG. 2. In some embodiments, the semiconductor patterns SP may be formed of or include at least one of silicon, germanium, silicon-germanium, or indium gallium zinc oxide (IGZO). Each of the semiconductor patterns SP may include a first impurity region SD1, a second impurity region SD2, and a channel region CH.

The channel region CH may be provided between the first and second impurity regions SD1 and SD2. The first and second impurity regions SD1 and SD2 may be doped to have a first conductivity type (e.g., an n-type). The channel region CH may be undoped or may be doped to have a second conductivity type (e.g., a p-type) different from the first conductivity type.

The channel region CH may correspond to the channel region of the memory cell transistor MCT of FIG. 1. The first and second impurity regions SD1 and SD2 may correspond to the source and drain electrodes, respectively, of the memory cell transistor MCT of FIG. 1.

The semiconductor patterns SP may be provided on the cell region CAR of the substrate 100. Each of the first to fourth stacks SS1-SS4 may include first to fourth rows R1, R2, R3, and R4 of the semiconductor patterns SP. Each of the first to fourth rows R1-R4 may include the semiconductor patterns SP, which are vertically stacked to be overlapped with each other. Although each of the first to fourth rows R1-R4 is illustrated to have six vertically-stacked semiconductor patterns SP, the inventive concept is not limited to this example. It will be understood that each of the first to fourth rows R1-R4 can include more than six vertically-stacked semiconductor patterns SP. The first to fourth rows R1-R4 may be spaced apart from each other in the first direction D1.

Each of the first to fourth stacks SS1-SS4 may further include first conductive lines CL1, which are vertically stacked on the substrate 100. In each of the first to fourth stacks SS1-SS4, the first conductive lines CL1 may be vertically spaced apart from each other by the insulating layers IL, as illustrated in FIG. 3C. Each of the insulating layers IL may be interposed between each vertically adjacent pair of the first conductive lines CL1.

The first conductive lines CL1 may be provided to have a line-shaped or bar-shaped structure extending in the first direction D1. In some embodiments, each of the first conductive lines CL1 may extend longitudinally in the first direction D1. The first conductive lines CL1 may extend from the cell region CAR of the substrate 100 onto the contact region CTR.

In some embodiments, each of the first conductive lines CL1 may be in direct contact with the semiconductor patterns SP, as illustrated in FIG. 3A. In some embodiments, each of the first conductive lines CL1 may be positioned at substantially the same level as a corresponding one of the semiconductor patterns SP, as illustrated in FIG. 3A. In some embodiments, as illustrated in FIG. 3A, one of the first conductive lines CL1 has a lower surface, which faces the substrate 100, a corresponding one of the semiconductor patterns SP, has a lower surface, which faces the substrate 100, and the lower surfaces of the one of the first conductive lines CL1 and the corresponding one of the semiconductor patterns SP are at the same level (i.e., coplanar). Each of the first conductive lines CL1 may be connected to a corresponding one of the first impurity regions SD1 of the semiconductor patterns SP. Each of the semiconductor patterns SP of the first to fourth rows R1-R4, which is positioned at the same level as a corresponding one of the first conductive lines CL1, may extend in the second direction D2.

Referring to FIG. 3C, each of the first to fourth stacks SS1-SS4 may have a stepwise structure on the contact region CTR of the substrate 100. Lengths, in the first direction D1, of the first conductive lines CL1 stacked on the contact region CTR may decrease with increasing distance from the top surface of the substrate 100. For example, the length of the lowermost one of the first conductive lines CL1 may be longer than those of the others. The length of the uppermost one of the first conductive lines CL1 may be shorter than those of the others.

The first conductive lines CL1 may be formed of or include a conductive material. For example, the conductive material may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth). The first conductive lines CL1 may be used as the bit lines BL described with reference to FIG. 1.

Each of the first to fourth stacks SS1-SS4 may further include data storing elements DS, which are vertically stacked on the substrate 100. The data storing elements DS, which are vertically stacked on the substrate 100, may be spaced apart from each other by the insulating layers IL. Each of the data storing elements DS may be extended, in the second direction D2, from a corresponding one of the semiconductor patterns SP.

In some embodiments, each of the data storing elements DS may be in direct contact with a corresponding one of the semiconductor patterns SP, as illustrated in FIG. 3A. As an example, each of the data storing elements DS may be positioned at substantially the same level as the corresponding one of the semiconductor patterns SP. Each of the data storing elements DS may be connected to the second impurity region SD2 of the corresponding one of the semiconductor patterns SP.

Referring to FIG. 3D, each of the data storing elements DS may include a first electrode EL1, a dielectric layer DL, and a second electrode EL2. For example, the data storing element DS according to an embodiment of the inventive concept may be a capacitor.

The first electrode EL1 may be directly connected to the second impurity region SD2 of the semiconductor pattern SP. In some embodiments, the first electrode EL1 may have a hollow cylinder shape, as illustrated in FIG. 3D. The first electrode EL1 may be formed of or include at least one of metallic materials, metal nitrides, or metal silicides. For example, the first electrode EL1 may be formed of or include at least one of refractory metals (e.g., cobalt, titanium, nickel, tungsten, or molybdenum). The first electrode EL1 may be formed of or include at least one of metal nitrides (e.g., titanium nitride, titanium silicon nitride, titanium aluminum nitride, tantalum nitride, tantalum silicon nitride, tantalum aluminum nitride, or tungsten nitride).

The dielectric layer DL may be interposed between the first electrode EL1 and the second electrode EL2. The dielectric layer DL may be provided to directly cover an inner side surface of the first electrode EL1, as illustrated in FIG. 3D. For example, the dielectric layer DL may be formed of or include at least one of metal oxides (e.g., hafnium oxide, zirconium oxide, aluminum oxide, lanthanum oxide, tantalum oxide, and titanium oxide) or perovskite dielectric materials (e.g., $SrTiO_3$(STO), $(Ba,Sr)TiO_3$ (BST), $BaTiO_3$, PZT, and PLZT).

The second electrode EL2 may be provided on the dielectric layer DL. The second electrode EL2 may be provided to fill a cylindrical inner space of the first electrode EL1, as illustrated in FIG. 3D. The second electrode EL2 may be connected to a third conductive line CL3 to be described below. The second electrode EL2 may be formed of or include at least one of doped silicon, metallic materials, metal nitrides, or metal silicides. As an example, the second electrode EL2 may include substantially the same material as the first electrode EL1.

Second conductive lines CL2 may be provided on the cell region CAR of the substrate 100 to penetrate the first to fourth stacks SS1-SS4. The second conductive lines CL2 may be pillar-shaped or bar-shaped patterns extending in a direction normal (e.g., perpendicular) to the top surface of the substrate 100 (i.e., in the third direction D3). In some embodiments, each of the second conductive lines CL2 may extend longitudinally in the third direction D3. The second conductive lines CL2 of each of the first to fourth stacks SS1-SS4 may be arranged in the first direction D1. Each of the second conductive lines CL2 may be provided adjacent to a corresponding one of the first to fourth rows R1-R4 of the semiconductor patterns SP, as illustrated in FIG. 2.

As an example, the first one of the second conductive lines CL2 penetrating the third stack SS3 may be adjacent to side surfaces of the semiconductor patterns SP of the first row R1. The first one of the second conductive lines CL2 may vertically extend along the side surfaces of the semiconductor patterns SP of the first row R1. The second one of the second conductive lines CL2 penetrating the third stack SS3 may be placed adjacent to the side surfaces of the semiconductor patterns SP of the second row R2. The second one of the second conductive lines CL2 may vertically extend along the side surfaces of the semiconductor patterns SP of the second row R2. A vertical insulating pattern VIP may be interposed between the first one of the second conductive lines CL2 and the semiconductor patterns SP of the second row R2. The vertical insulating pattern VIP may be formed of or include, for example, silicon oxide.

Each of the second conductive lines CL2 may be placed to face the channel regions CH of the semiconductor patterns SP adjacent thereto, as illustrated in FIGS. 2 and 3B. The second conductive lines CL2 may be used as gate electrodes. For example, the second conductive lines CL2 may be used as the gate electrodes of the memory cell transistors MCT of FIG. 1. A gate insulating layer GI may be provided between the second conductive line CL2 and the channel regions CH of the semiconductor patterns SP. The gate insulating layer GI may be a single- or multi-layered structure that is formed of or include at least one of high-k dielectric materials, silicon oxide, silicon nitride, or silicon oxynitride. In some embodiments, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The second conductive lines CL2 may be formed of or include a conductive material, and the conductive material may be one of doped semiconductor materials, conductive metal nitrides, metallic materials, and metal-semiconductor compounds. The second conductive lines CL2 may be used as the word lines WL described with reference to FIG. 1.

Third conductive lines CL3 may be provided on the cell region CAR of the substrate 100 to extend parallel to the first to fourth stacks SS1-SS4 or in the first direction D1. The first one of the third conductive lines CL3 may be provided between the first and second stacks SS1 and SS2, and the second one of the third conductive lines CL3 may be provided between the third and fourth stacks SS3 and SS4.

In some embodiments, as illustrated in FIG. 3A, the third conductive lines CL3 may be directly connected to the second electrode EL2 of the data storing element DS previously described with reference to FIG. 3D. The first one of the third conductive lines CL3 may be connected in common to the second electrodes EL2 of the capacitors of the first and second stacks SS1 and SS2, and the second one of the third conductive lines CL3 may be connected in common to the second electrodes EL2 of the capacitors of the third and fourth stacks SS3 and SS4.

The third conductive lines CL3 may be formed of or include a conductive material, and the conductive material may be one of doped semiconductor materials, conductive metal nitrides, metallic materials, and metal-semiconductor compounds. The third conductive lines CL3 may be used as the ground line PP described with reference to FIG. 1.

A second interlayered insulating layer ILD2 may be provided on the first interlayered insulating layer ILD1 to cover (e.g., partially cover or entirely cover) the first to fourth stacks SS1-SS4. Each of the first and second interlayered insulating layers ILD1 and ILD2 may be formed of or include, for example, at least one of silicon oxide, silicon nitride, or silicon oxynitride.

In some embodiments, the first and second stacks SS1 and SS2 may have substantially the same structure as the third and fourth stacks SS3 and SS4. The first and second stacks SS1 and SS2 and the third and fourth stacks SS3 and SS4 may be provided to be symmetric to each other. In some embodiments, the first and second stacks SS1 and SS2 may be provided to have a mirror symmetry with respect to the third conductive line CL3 therebetween. The third and fourth stacks SS3 and SS4 may be provided to have a mirror symmetry with respect to the third conductive line CL3 therebetween. The second and third stacks SS2 and SS3 may be provided to have a mirror symmetry with respect to the second interlayered insulating layer ILD2 interposed therebetween.

Figure 4:
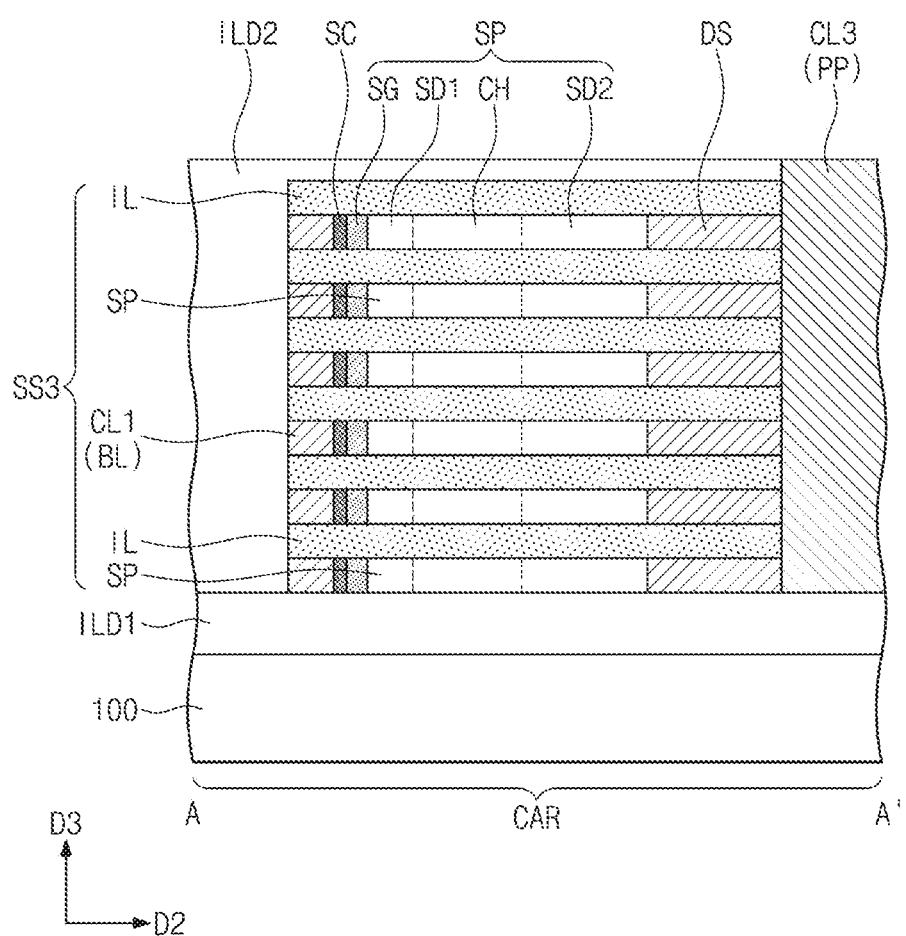
FIG. 4 is a cross-sectional view of a three-dimensional semiconductor memory device according to an embodiment of the inventive concept, taken along line A-A' of FIG. 2.

FIG. 4 is a cross-sectional view of a three-dimensional semiconductor memory device according to an embodiment of the inventive concept, taken along line A-A' of FIG. 2. In the following description, an element previously described with reference to FIGS. 1, 2, and 3A to 3D, may be identified by the same reference number without repeating description thereof.

Referring to FIG. 4, each of the semiconductor patterns SP may further include an end layer SG interposed between the first conductive line CL1 and the first impurity region SD1. In some embodiments, the end layer SG may be a portion of the semiconductor pattern SP. In some embodiments, the end layer SG may be a pattern that is additionally formed between the semiconductor pattern SP and the first conductive line CL1.

The end layer SG may be formed of or include a semiconductor material having a relatively small band gap. In the case where the semiconductor pattern SP includes silicon, the end layer SG may be formed of or include a germanium-containing silicon material. For example, the first and second impurity regions SD1 and SD2 and the channel region CH of the semiconductor pattern SP may be formed of or include silicon, and the end layer SG may be formed of or include silicon-germanium.

A silicide layer SC may be interposed between the first conductive line CL1 and the end layer SG. The silicide layer SC may be formed of or include at least one of metal-semiconductor compounds (e.g., tungsten silicide, cobalt silicide, titanium silicide, and so forth).

In some embodiments, the formation of the end layer SG may include performing a plasma-assisted doping (PLAD) process on the first impurity region SD1 of the semiconductor pattern SP to dope a portion of the first impurity region SD1 with a semiconductor material (e.g., germanium) having a small band gap. After the formation of the end layer SG, a metal-silicide process may be performed to form the silicide layer SC. After the formation of the silicide layer SC, the first conductive line CL1 may be formed.

Meanwhile, during an operation of the memory device, holes may be accumulated in the semiconductor pattern SP by a floating body effect. The accumulated holes may be recombined with electrons in the capacitor of the memory cell, and in this case, data stored in the capacitor may be lost.

In the present embodiment, the end layer SG may have a band gap smaller than those of the first and second impurity regions SD1 and SD2 and the channel region CH. The end layer SG may be used to remove a hole barrier and thereby to allow holes, which are accumulated in the semiconductor pattern SP, to be discharged to the outside through the first conductive line CL1. That is to say, in the semiconductor memory device according to the present embodiment, the end layer SG may be further provided to discharge the accumulated holes to the outside through the first conductive line CL1.

Figure 5:
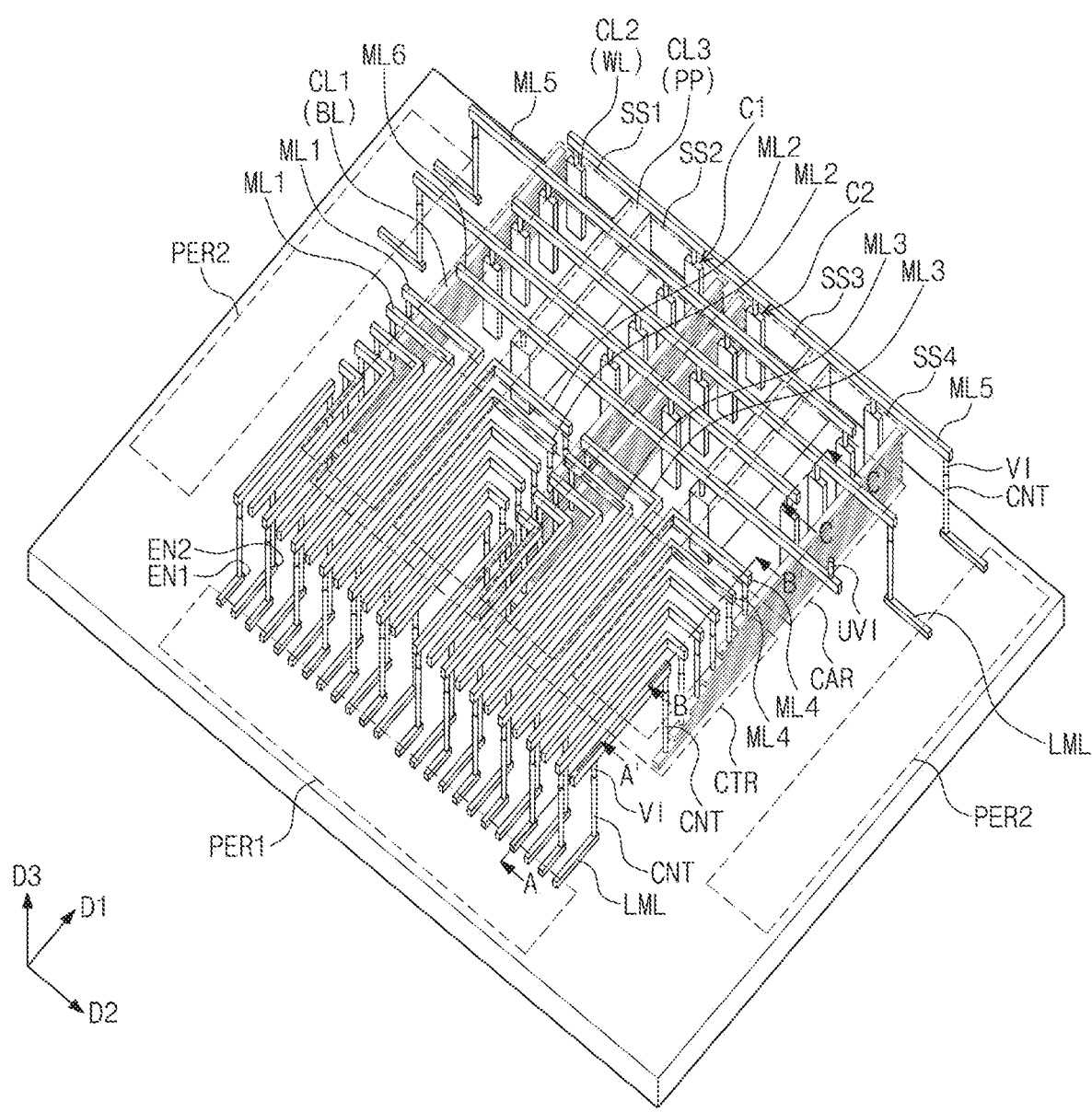
FIG. 5 is a perspective view illustrating a three-dimensional semiconductor memory device according to an embodiment of the inventive concept.
Figure 6A:
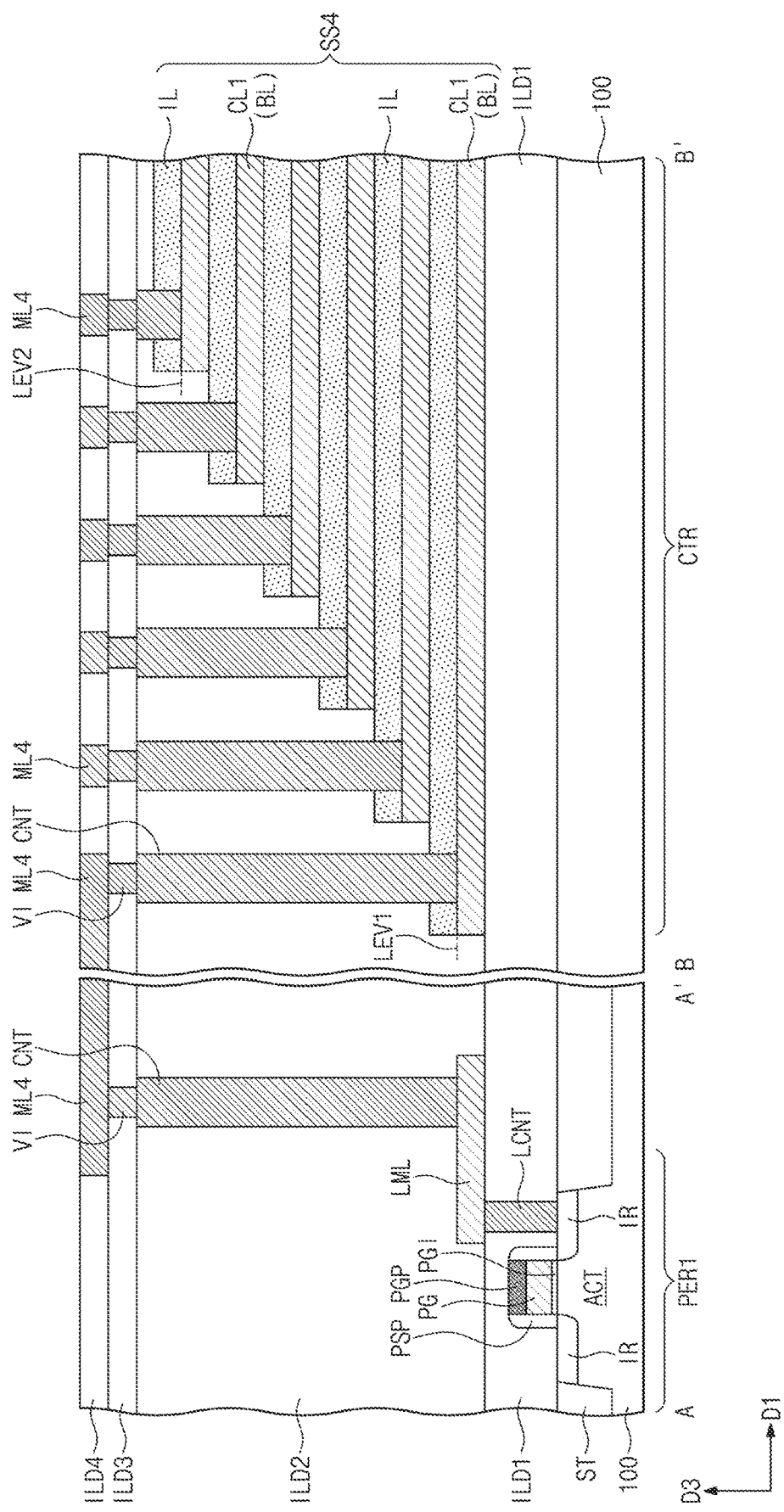
FIG. 6A is a cross-sectional view taken along lines A-A' and B-B' of FIG. 5.
Figure 6B:
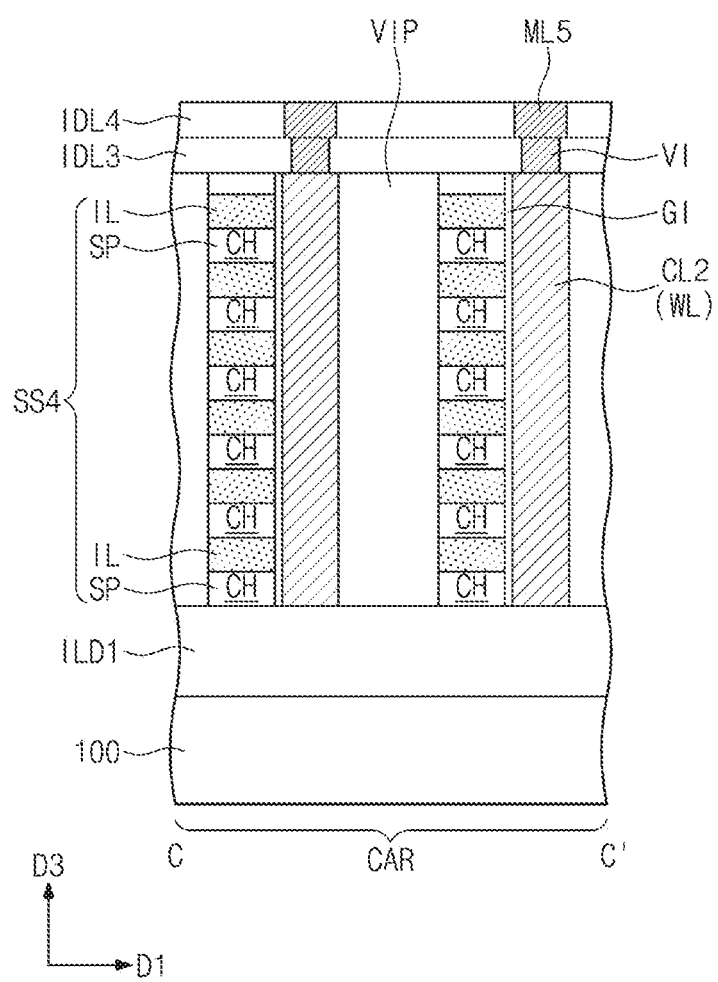
FIG. 6B is a cross-sectional view taken along line C-C' of FIG. 5.

FIG. 5 is a perspective view illustrating a three-dimensional semiconductor memory device according to an embodiment of the inventive concept. FIG. 6A is a cross-sectional view taken along lines A-A' and B-B' of FIG. 5. FIG. 6B is a cross-sectional view taken along line C-C' of FIG. 5. In the following description, an element previously described with reference to FIGS. 1, 2, and 3A to 3D, may be identified by the same reference number without repeating description thereof.

Referring to FIGS. 5, 6A, and 6B, the substrate 100 may include the cell region CAR, the contact region CTR, a first peripheral circuit region PER1, and a second peripheral circuit regions PER2. The contact region CTR may be interposed between the cell region CAR and the first peripheral circuit region PER1.

The first and second peripheral circuit regions PER1 and PER2 may include peripheral transistors, resistors, and capacitors, which are electrically connected to the cell arrays. As an example, the first peripheral circuit region PER1 may include a sense amplifier connected to the bit lines BL on the cell region CAR. The second peripheral circuit regions PER2 may include a row decoder and/or sub-word line drivers connected to the word lines WL on the cell region CAR.

Referring to FIG. 6A, a device isolation layer ST may be provided on the first peripheral circuit region PER1 of the substrate 100 to define an active region ACT. A peripheral gate electrode PG may be provided on the active region ACT to cross the active region ACT. Source/drain regions IR may be provided in two portions of the active region ACT, which are located at opposing sides of the peripheral gate electrode PG. A peripheral gate insulating layer PGI may be interposed between the peripheral gate electrode PG and the active region ACT. A gate capping layer PGP may be provided on the peripheral gate electrode PG. A pair of spacers PSP may be provided on opposite side surfaces of the peripheral gate electrode PG. The first interlayered insulating layer ILD1 may be provided to cover the active region ACT, the spacers PSP, and the gate capping layer PGP.

A lower interconnection line LML may be provided on the first interlayered insulating layer ILD1 to extend in a direction toward the cell region CAR. A lower contact LCNT may be provided to penetrate the first interlayered insulating layer ILD1 and may be used to electrically connect the lower interconnection line LML to the source/drain region IR in the active region ACT. Although not shown, in some embodiments, an additional lower contact LCNT may be provided to penetrate the first interlayered insulating layer ILD1 and the gate capping layer PGP and may be used to electrically connect the lower interconnection line LML to the peripheral gate electrode PG.

The peripheral transistors on the second peripheral circuit regions PER2 may be configured to have substantially the same structure as that of the peripheral transistor on the first peripheral circuit region PER1 shown in FIG. 6A.

The first to fourth stacks SS1-SS4 may be provided on the cell region CAR and the contact region CTR of the substrate 100. The first to fourth stacks SS1-SS4 may be provided on the first interlayered insulating layer ILD1. The first to fourth stacks SS1-S54 may be positioned at a level higher than those of the peripheral transistors of the first and second peripheral circuit regions PER1 and PER2. In order to reduce complexity in the drawings, the first to fourth stacks SS1-SS4, from which the semiconductor patterns SP previously described with reference to FIG. 2 are omitted, are illustrated.

Contacts CNT may be provided to penetrate the second interlayered insulating layer ILD2. Some of the contacts CNT may be provided on the first to fourth stacks SS1-S54 to be in contact with the first conductive lines CL1 on the contact region CTR. Others of the contacts CNT may be provided on the first and second peripheral circuit regions PER1 and PER2 to be in contact with the lower interconnection lines LML.

The contacts CNT, which are in contact with the first conductive lines CL1 on the contact region CTR, may be arranged in the first direction D1 and may be spaced apart from each other in the first direction D1. The contacts CNT on the contact region CTR may be provided on the stepwise structure of each of the first to fourth stacks SS1-SS4. In some embodiments, the contacts CNT on the contact region CTR may have bottom surfaces whose levels are elevated with decreasing distance from the cell region CAR, as illustrated in FIG. 6A. For example, the bottom surface of the contact CNT adjacent to the first peripheral circuit region PER1 may be positioned at a first level LEV1, and the bottom surface of the contact CNT adjacent to the cell region CAR may be positioned at a second level LEV2. The second level LEV2 may be higher than the first level LEV1.

Referring to FIG. 5, in some embodiments, the contacts CNT, which are in contact with the lower interconnection lines LML on the first peripheral circuit region PER1, may be arranged to form a zigzag shape in the second direction D2. Since the contacts CNT are arranged in the zigzag shape on the first peripheral circuit region PER1, it may be possible to secure a sufficient process margin between adjacent ones of the contacts CNT. For example, the first one of the lower interconnection lines LML on the first peripheral circuit region PER1 may have a first end EN1. The second one of the lower interconnection lines LML on the first peripheral circuit region PER1 may have a second end EN2. The second end EN2 may be closer to the contact region CTR than the first end EN1.

Third and fourth interlayered insulating layers ILD3 and ILD4 may be provided on the second interlayered insulating layer ILD2. Vias VI may be provided in the third interlayered the insulating layers ILD3. First to sixth interconnection lines ML1-ML6 may be provided in the fourth interlayered the insulating layers ILD4. The first to sixth interconnection lines ML1-ML6 may be in contact with the vias VI.

On the contact region CTR, the first to fourth interconnection lines ML1-ML4 may be electrically connected to the first conductive lines CL1 of the first to fourth stacks SS1-SS4 through the contacts CNT and the vias VI.

On the contact region CTR, the first interconnection lines ML1 may be coupled to the first conductive lines CL1, respectively, of the first stack SS1. On the contact region CTR, the second interconnection lines ML2 may be coupled to the first conductive lines CL1, respectively, of the second stack SS2. On the contact region CTR, the third interconnection lines ML3 may be coupled to the first conductive lines CL1, respectively, of the third stack SS3. On the contact region CTR, the fourth interconnection lines ML4 may be coupled to the first conductive lines CL1, respectively, of the fourth stack SS4.

The number of the first interconnection lines ML1 may equal the number of the first conductive lines CL1 of the first stack SS1. The number of the second interconnection lines ML2 may equal the number of the first conductive lines CL1 of the second stack SS2. The number of the third interconnection lines ML3 may equal the number of the first conductive lines CL1 of the third stack SS3. The number of the fourth interconnection lines ML4 may equal the number of the first conductive lines CL1 of the fourth stack SS4.

Each of the first to fourth interconnection lines ML1-ML4 may include a first portion extending in the first direction D1 and a second portion extending in the second direction D2. For example, the first portions of the first interconnection lines ML1 may be spaced apart from each other by substantially the same distant in the second direction D2. The second portions of the first interconnection lines ML1 may be connected to the contacts CNT on the first conductive lines CL1.

The first to fourth interconnection lines ML1-ML4 may extend from the contact region CTR to the first peripheral circuit region PER1. The first to fourth interconnection lines ML1-ML4 on the first peripheral circuit region PER1 may be electrically connected to the lower interconnection lines LML through the contacts CNT and the vias VI.

The fifth interconnection lines ML5 on the cell region CAR may be electrically connected to the second conductive lines CL2 through the vias VI. The fifth interconnection lines ML5 may extend in the second direction D2. In some embodiments, the fifth interconnection lines ML5 may extend longitudinally in the second direction D2, as illustrated in FIG. 5. The fifth interconnection lines ML5 may extend from the cell region CAR to the second peripheral circuit regions PER2. The fifth interconnection lines ML5 on the second peripheral circuit regions PER2 may be electrically connected to the lower interconnection lines LML through the contacts CNT and the vias VI.

Each of the fifth interconnection lines ML5 may be connected in common to the second conductive lines CL2 of the first to fourth stacks SS1-SS4. As an example, the second conductive lines CL2 of the second stack SS2, which are arranged in the first direction D1, may constitute a first column C1. The second conductive lines CL2 of the third stack SS3, which are arranged along the first direction D1, may constitute a second column C2.

Still referring to FIG. 5, in some embodiments, the first one of the second conductive lines CL2 of the first column C1 and the first one of the second conductive lines CL2 of the second column C2 may be aligned to each other in the second direction D2. In some embodiments, the first one of the second conductive lines CL2 of the first column C1 and the first one of the second conductive lines CL2 of the second column C2 may be connected in common to the first one of the fifth interconnection lines ML5, as illustrated in FIG. 5. The second one of the second conductive lines CL2 of the first column C1 and the second one of the second conductive lines CL2 of the second column C2 may be aligned to each other in the second direction D2. The second one of the second conductive lines CL2 of the first column C1 and the second one of the second conductive lines CL2 of the second column C2 may be connected in common to the second one of the fifth interconnection lines ML5.

The first one of the fifth interconnection lines ML5 may be extended onto the second peripheral circuit region PER2, which is provided near a side of the cell region CAR. The second one of the fifth interconnection lines ML5 may be extended onto the second peripheral circuit region PER2, which is provided near an opposite side of the cell region CAR.

On the cell region CAR, the sixth interconnection line ML6 may be electrically connected to the third conductive lines CL3 through the vias VI. The sixth interconnection line ML6 may extend in the second direction D2. In some embodiments, the sixth interconnection line ML6 may extend longitudinally in the second direction D2. The sixth interconnection line ML6 may be connected to an upper interconnection structure (not shown) through an upper via UVI.

Each of the lower interconnection line LML, the lower contact LCNT, the contacts CNT, the vias VI, and the first to sixth interconnection lines ML1-ML6 may be formed of or include at least one of metallic materials (e.g., aluminum, copper, tungsten, molybdenum, or cobalt).

Hereinafter, various embodiments of the inventive concept will be described. In the following description, elements previously described with reference to FIGS. 1, 2, 3A, 3B, 3C, 3D, 4, 5, 6A, and 6B, may be identified by the same reference number without repeating description thereof.

Figure 7A:
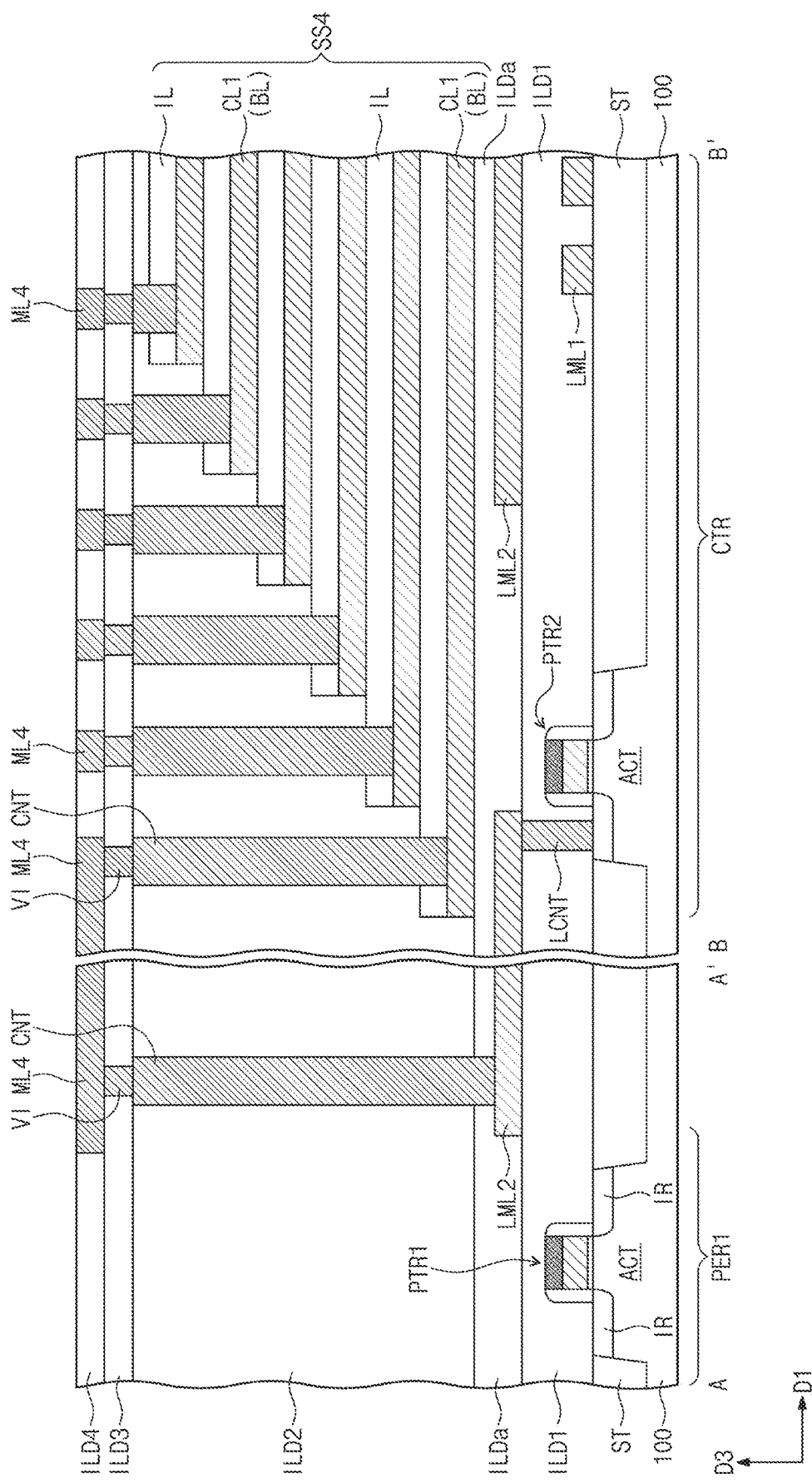
FIG. 7A is a cross-sectional view taken along the lines A-A' and B-B' of FIG. 5.
Figure 7B:
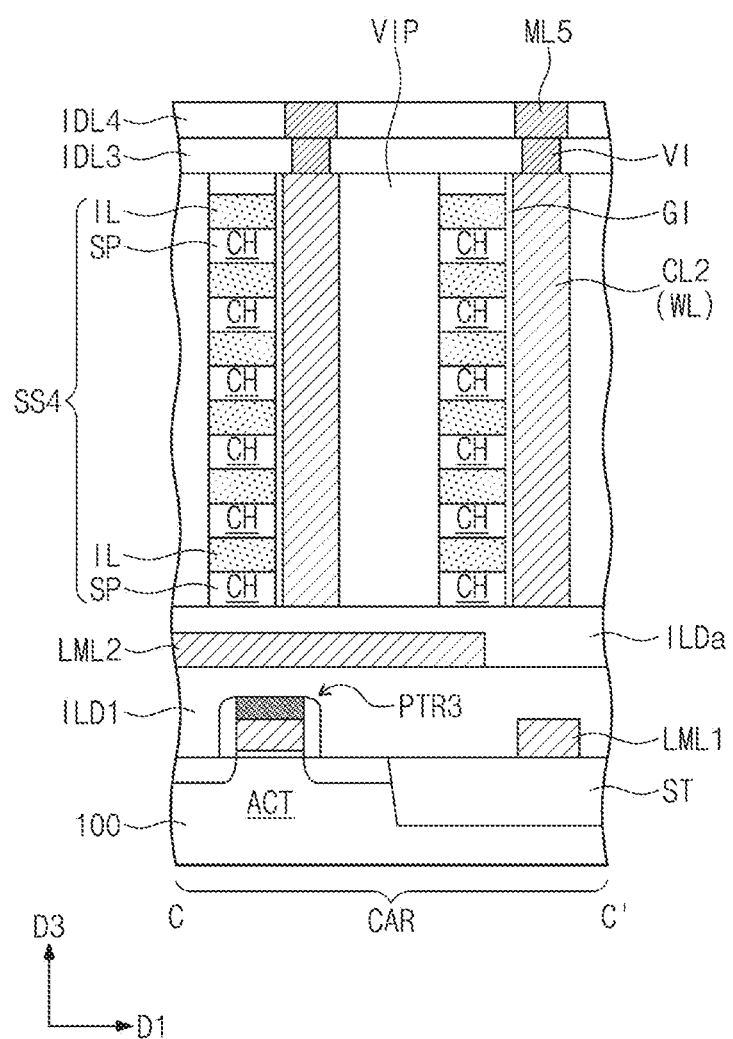
FIG. 7B is a cross-sectional view taken along the line C-C' of FIG. 5.

FIG. 7A is a cross-sectional view taken along the lines A-A' and B-B' of FIG. 5. FIG. 7B is a cross-sectional view taken along the line C-C' of FIG. 5. Referring to FIGS. 7A and 7B, first peripheral transistors PTR1 may be provided on the first and second peripheral circuit regions PER1 and PER2. In addition, at least one second peripheral transistor PTR2 may be provided on the contact region CTR, and at least one third peripheral transistor PTR3 may be provided on the cell region CAR.

The second and third peripheral transistors PTR2 and PTR3 may be configured to perform substantially the same function as those of the first peripheral transistors PTR1 on the first and second peripheral circuit regions PER1 and PER2. For example, the second and third peripheral transistors PTR2 and PTR3, along with the first peripheral transistors PTR1, may constitute a peripheral circuit for driving the memory cell. In the present embodiment, since the peripheral transistors constituting the peripheral circuit are placed not only on the first and second peripheral circuit regions PER1 and PER2 but also on the contact region CTR and the cell region CAR, it may be possible to secure a sufficiently large region for the peripheral transistors.

First lower interconnection lines LML1 may be provided on the device isolation layer ST or on the substrate 100. The first lower interconnection lines LML1 may be provided on the contact region CTR and the cell region CAR.

The first interlayered insulating layer ILD1 may be provided to cover the first to third peripheral transistors PTR1, PTR2, and PTR3 and the first lower interconnection lines LML1. An additional interlayered insulating layer ILDa may be provided between the first interlayered insulating layer ILD1 and the second interlayered insulating layer ILD2. Second lower interconnection lines LML2 may be provided in the additional interlayered insulating layer ILDa.

In some embodiments, the second lower interconnection line LML2 may be connected to the second peripheral transistor PTR2 through the lower contact LCNT penetrating the first interlayered insulating layer ILD1. That is, the first conductive line CL1 may be electrically connected to the second peripheral transistor PTR2.

Since the first and second lower interconnection lines LML1 and LML2 are provided not only on the first and second peripheral circuit regions PER1 and PER2 but also on the contact region CTR and the cell region CAR, it may be possible to increase a degree of freedom in constructing a routing structure of the memory device. Furthermore, it may be possible to secure a sufficiently large region for interconnection lines.

Figure 8A:
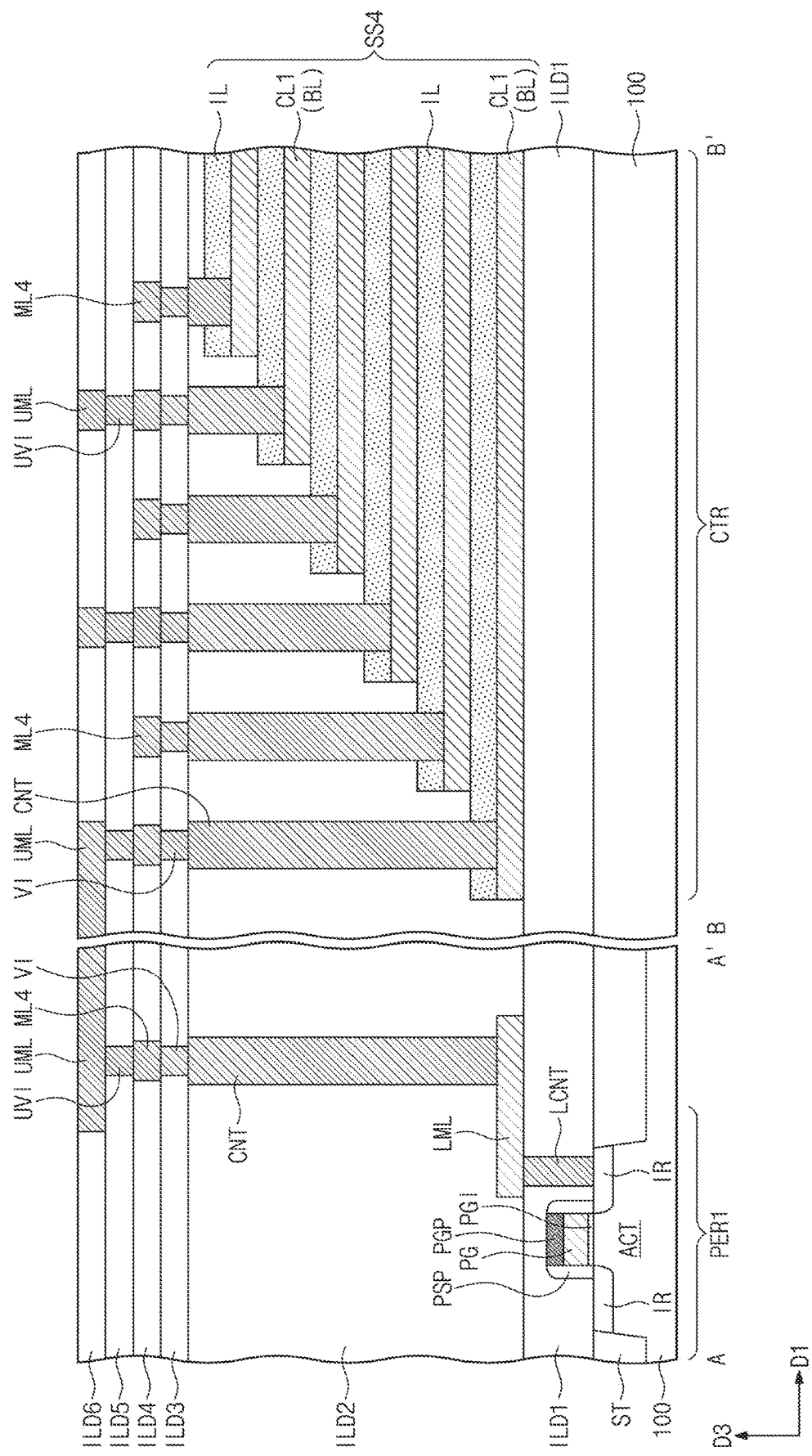
FIG. 8A is a cross-sectional view taken along the lines A-A' and B-B' of FIG. 5.
Figure 8B:
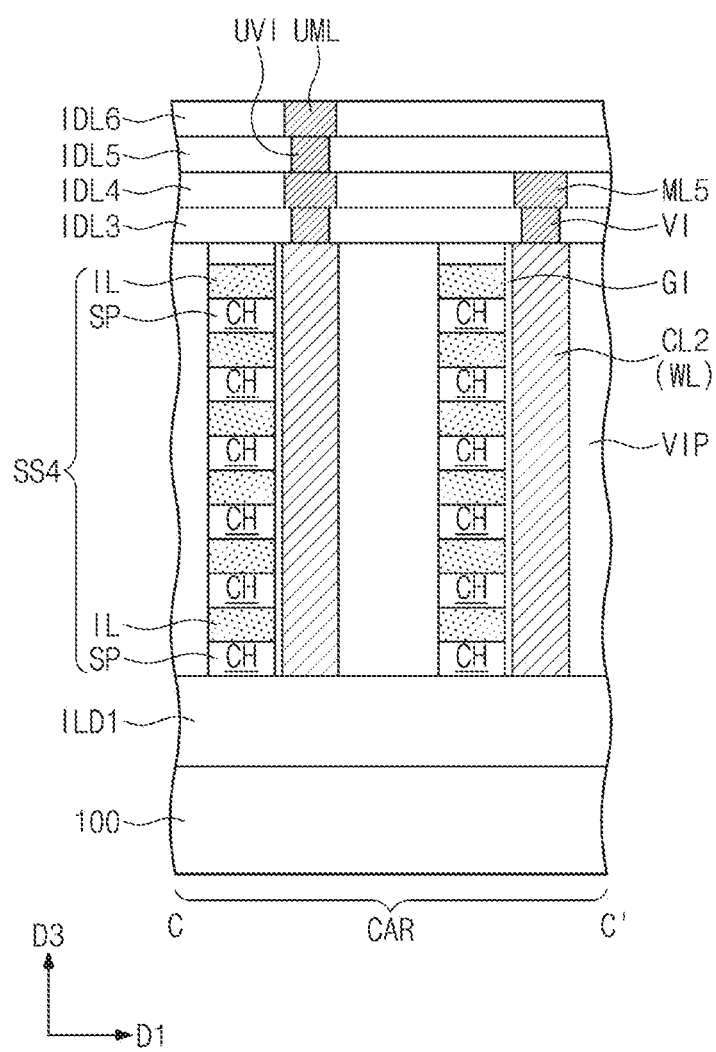
FIG. 8B is a cross-sectional view taken along the line C-C' of FIG. 5.

FIG. 8A is a cross-sectional view taken along the lines A-A' and B-B' of FIG. 5. FIG. 8B is a cross-sectional view taken along the line C-C' of FIG. 5. Referring to FIGS. 8A and 8B, a fifth interlayered insulating layer ILD5 and a sixth interlayered insulating layer ILD6 may be provided on the fourth interlayered insulating layer ILD4. The upper vias UVI may be provided in the fifth interlayered the insulating layers ILD5. Upper interconnection lines UML may be provided in the sixth interlayered the insulating layers ILD6. The upper interconnection lines UML may be in contact with the upper vias UVI. The upper vias UVI may be used to vertically connect the upper interconnection lines UML to the first to sixth interconnection lines ML1-ML6.

Referring to FIG. 8A, the first one of the fourth interconnection lines ML4 may be electrically connected to the upper interconnection line UML. The upper interconnection line UML connected to the first one of the fourth interconnection lines ML4 may be extended onto the first peripheral circuit region PER1. The second one of the fourth interconnection lines ML4 may be extended onto the first peripheral circuit region PER1 but may not be connected to the upper interconnection line UML. The third one of the fourth interconnection lines ML4 may be electrically connected to the upper interconnection line UML. The upper interconnection line UML connected to the third one of the fourth interconnection lines ML4 may be extended onto the first peripheral circuit region PER1. The fourth one of the fourth interconnection lines ML4 may be extended onto the first peripheral circuit region PER1 but may not be connected to the upper interconnection line UML.

Referring to FIG. 8B, the first one of the fifth interconnection lines ML5 may be electrically connected to the upper interconnection line UML. The upper interconnection line UML connected to the first one of the fifth interconnection lines ML5 may be extended onto the second peripheral circuit region PER2. The second one of the fifth interconnection lines ML5 may be extended onto the second peripheral circuit region PER2 but may not be connected to the upper interconnection line UML.

In the present embodiment, the upper interconnection lines UML, which are a part of the upper interconnection structure, may be further provided on the first to sixth interconnection lines ML1-ML6, and this may make it possible to increase a degree of freedom in constructing a routing structure. Furthermore, it may be possible to secure a sufficiently large region for interconnection lines.

Figure 9:
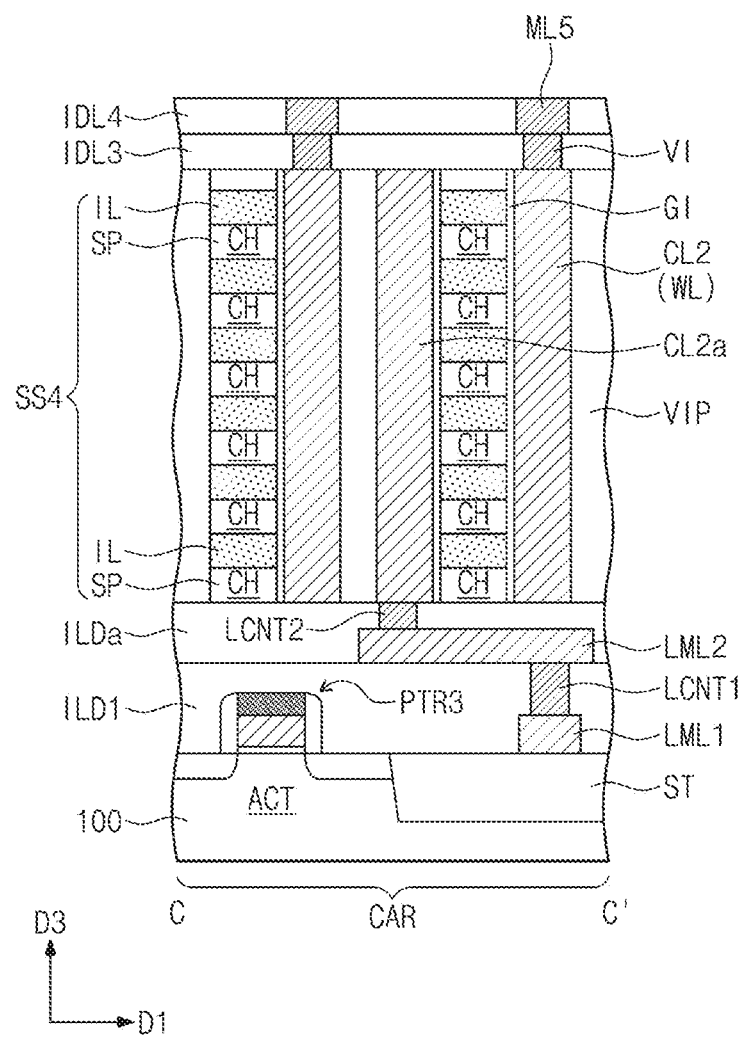
FIG. 9 is a cross-sectional view taken along the line C-C' of FIG. 5.

FIG. 9 is a cross-sectional view taken along the line C-C' of FIG. 5. Referring to FIGS. 2, 5, and 9, the second conductive line CL2 and an additional conductive line CL2a may be provided between the first row R1 of the semiconductor patterns SP and the second row R2 of the semiconductor patterns SP. In other words, the second conductive line CL2 and the additional conductive line CL2a may be provided to face opposite side surfaces of the vertical stack of the semiconductor patterns SP. The additional conductive line CL2a may extend parallel to the second conductive line CL2 or in the third direction D3.

In some embodiments, the additional conductive line CL2a may be used as a back-gate electrode for the memory cell transistor MCT. In some embodiments, the additional conductive line CL2a, along with the second conductive line CL2, may constitute a single word line WL. In some embodiments, the additional conductive line CL2a may be provided to be in direct contact with the semiconductor patterns SP, thereby serving as a body contact. The additional conductive line CL2a may be connected to other region of the device through the first and second lower interconnection lines LML1 and LML2.

Figure 10:
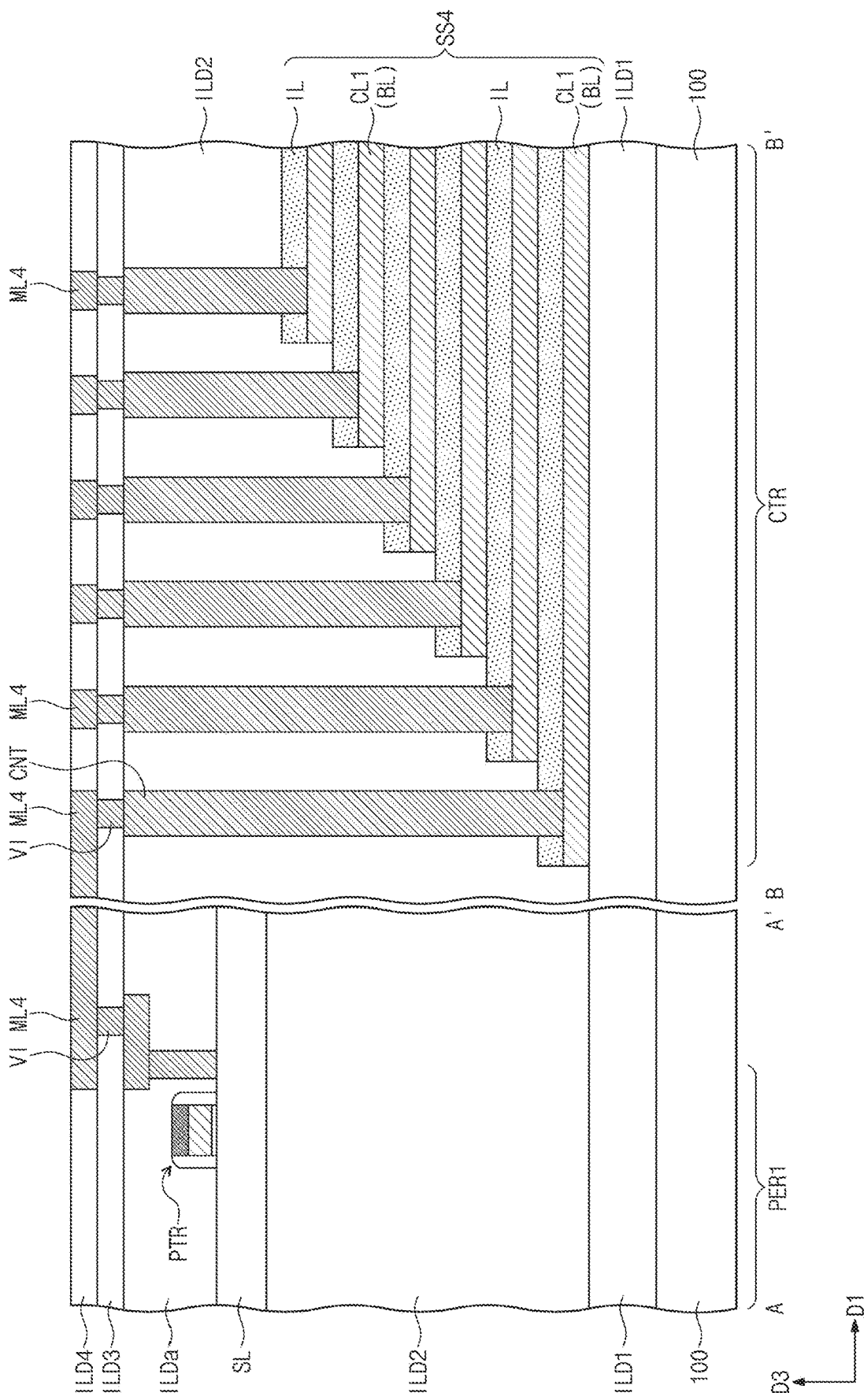
FIG. 10 is a cross-sectional view taken along the lines A-A' and B-B' of FIG. 5.

FIG. 10 is a cross-sectional view taken along the lines A-A' and B-B' of FIG. 5. Referring to FIG. 10, a semiconductor layer SL may be provided on the first peripheral circuit region PER1 to cover the second interlayered insulating layer ILD2. The semiconductor layer SL may be positioned at a level higher than the first to fourth stacks SS1-SS4. Peripheral transistors PTR may be formed on the semiconductor layer SL. The peripheral transistors on the second peripheral circuit regions PER2 may have substantially the same structure as that on the first peripheral circuit region PER1 shown in FIG. 10.

An additional interlayered insulating layer ILDa may be provided on the semiconductor layer SL to cover the peripheral transistors PTR. A top surface of the additional interlayered insulating layer ILDa may be substantially coplanar with a top surface of the second interlayered insulating layer ILD2, which is provided on the contact region CTR and the cell region CAR. The peripheral transistors PTR on the semiconductor layer SL may be electrically connected to the first and second conductive lines CL1 and CL2 through the first to fifth interconnection lines ML1-ML5.

Figure 11:
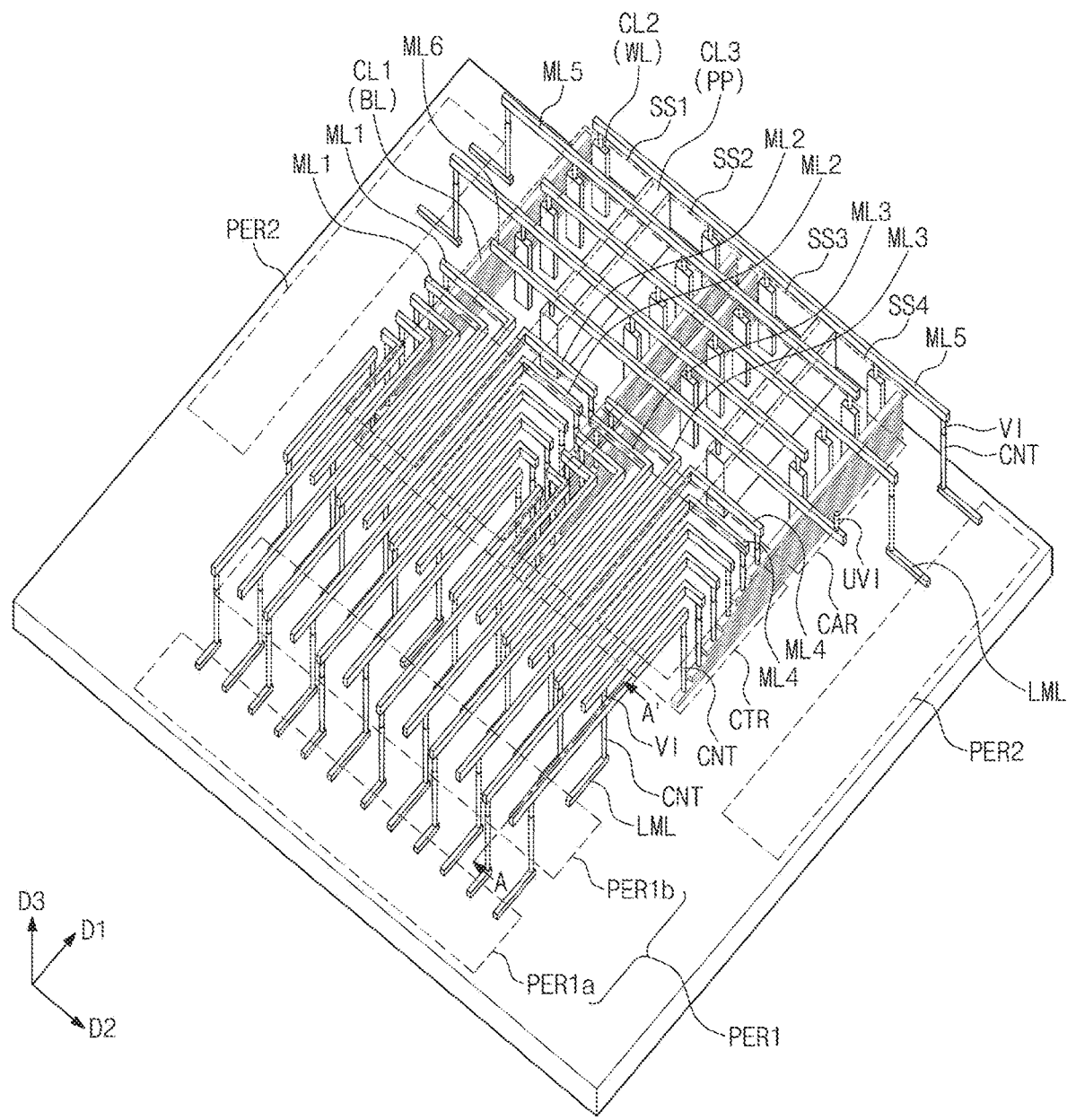
FIG. 11 is a perspective view illustrating a three-dimensional semiconductor memory device according to an embodiment of the inventive concept.
Figure 12:
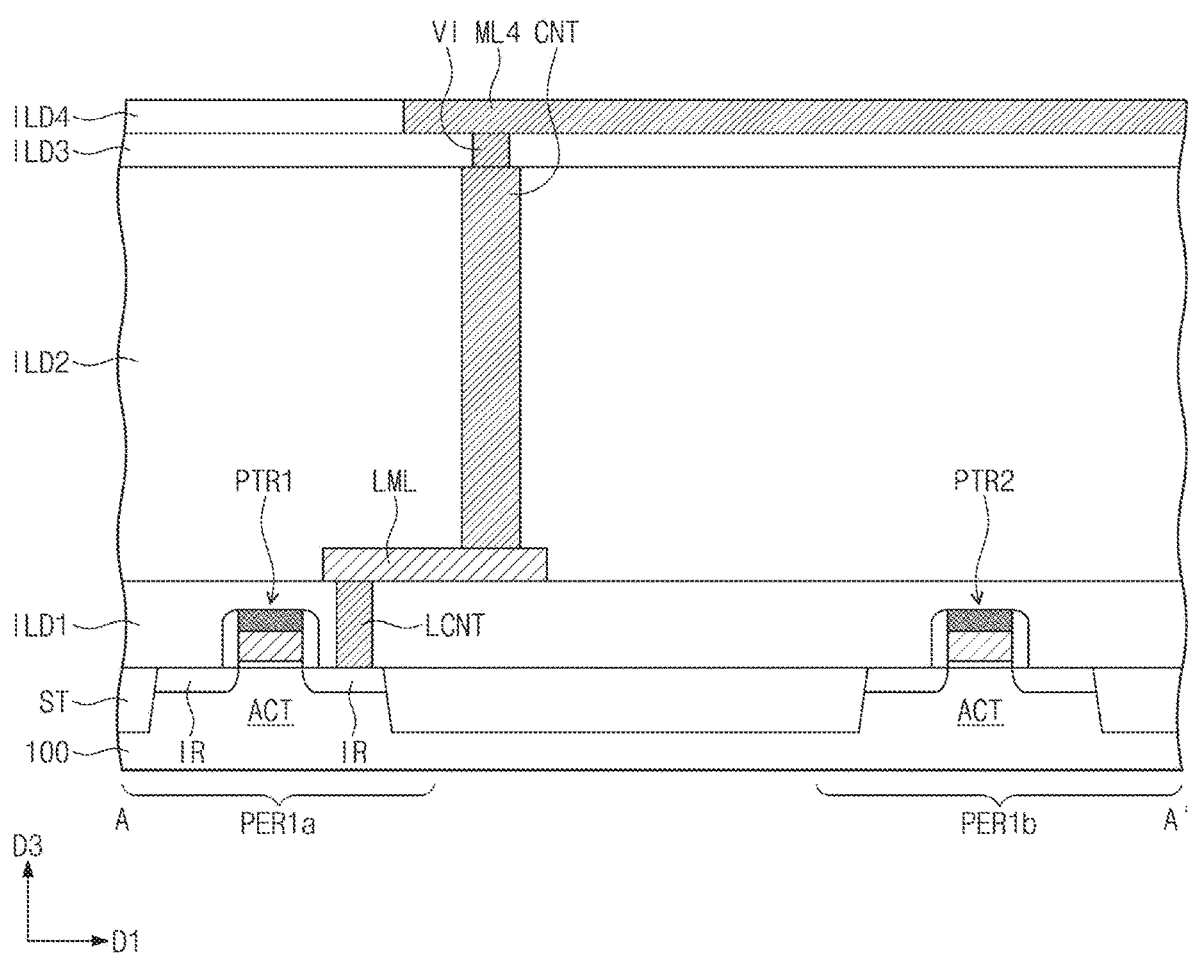
FIG. 12 is a cross-sectional view taken along a line A-A' of FIG. 5.

FIG. 11 is a perspective view illustrating a three-dimensional semiconductor memory device according to an embodiment of the inventive concept. FIG. 12 is a cross-sectional view taken along a line A-A' of FIG. 12. In order to reduce complexity in the drawings, the semiconductor patterns SP previously described with reference to FIG. 2 are not illustrated in FIGS. 11, 13, 14, 15, and 17 but it will be understood that the semiconductor patterns SP are provided in the device as illustrated in FIG. 2.

Referring to FIGS. 11 and 12, the first peripheral circuit region PER1 may include a first sub-region PER1a and a second sub-region PER1b. The second sub-region PER1b may be spaced apart from the first sub-region PER in the first direction D1. First and second peripheral transistors PTR1 and PTR2 may be provided on the first and second sub-regions PER1a and PER1b, respectively.

For example, the first one of the fourth interconnection lines ML4 may be extended onto the first sub-region PER1a. The second one of the fourth interconnection lines ML4 may be extended onto the second sub-region PER1b. The third one of the fourth interconnection lines ML4 may be extended onto the first sub-region PER1a. The fourth one of the fourth interconnection lines ML4 may be extended onto the second sub-region PER1b.

In the present embodiment, the first peripheral circuit region PER1 may be divided into two regions: that is, the first and second sub-regions PER1a and PER1b. Thus, it may be possible to separately dispose the first and second peripheral transistors PTR1 and PTR2, which constitute the peripheral circuit on the first peripheral circuit region PER1, on the first and second sub-regions PER1a and PER1b. As a result, it may be possible to secure a sufficiently large region for each of the peripheral transistors and to secure a relatively large distance between adjacent ones of the contacts CNT.

Figure 13:
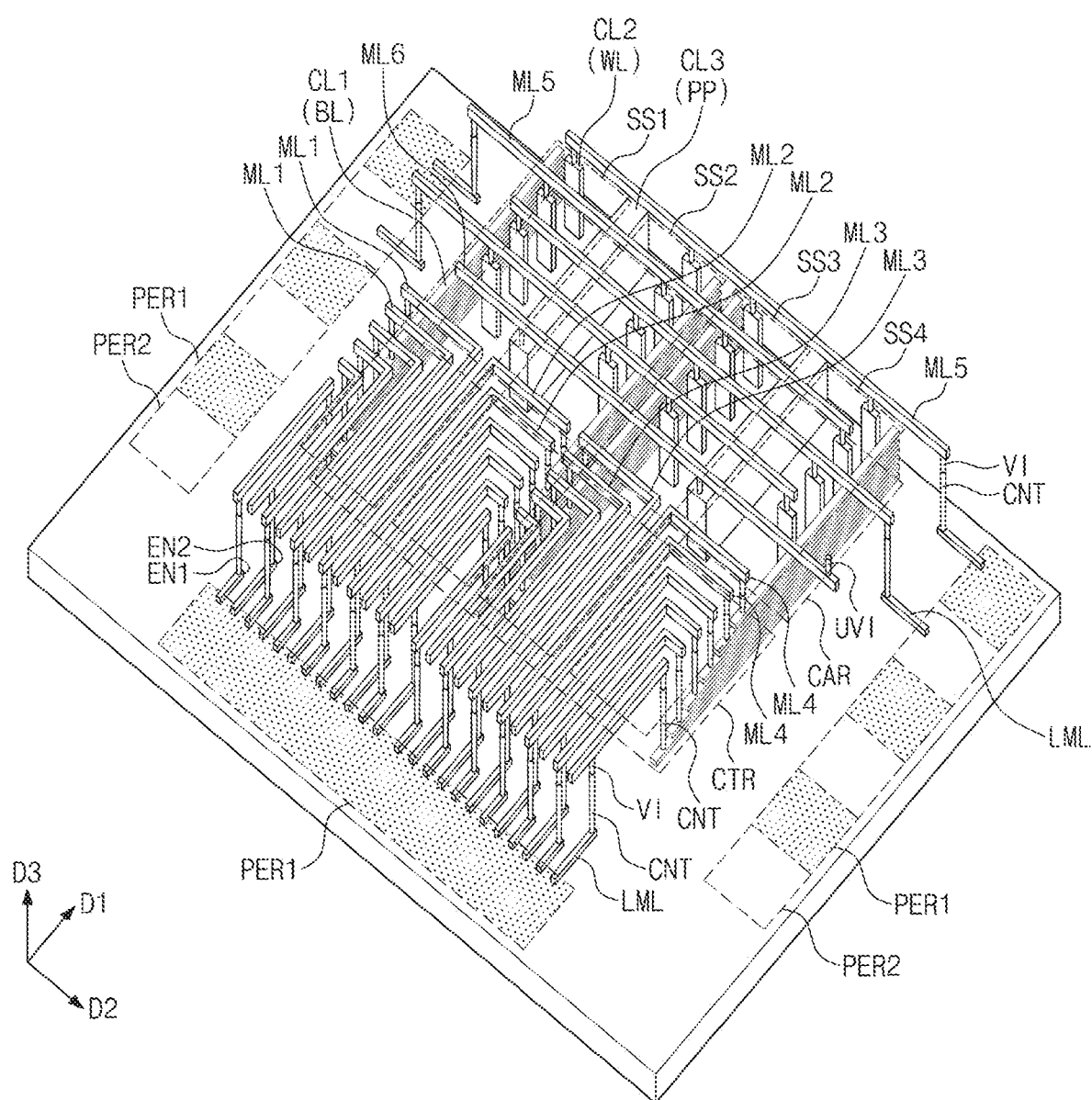
FIG. 13 is a perspective view illustrating a three-dimensional semiconductor memory device according to an embodiment of the inventive concept.

FIG. 13 is a perspective view illustrating a three-dimensional semiconductor memory device according to an embodiment of the inventive concept. Referring to FIG. 13, a plurality of the first peripheral circuit regions PER1 may be provided near the cell region CAR. For example, at least one of the first peripheral circuit regions PER1 may be configured to include the sense amplifiers.

The first peripheral circuit regions PER1 and the second peripheral circuit regions PER2 may be alternatingly arranged along a side of the cell region CAR or in the first direction D1. Similarly, the first peripheral circuit regions PER1 and the second peripheral circuit regions PER2 may also be alternatingly arranged in an opposite side of the cell region CAR or in the first direction D1.

Figure 14:
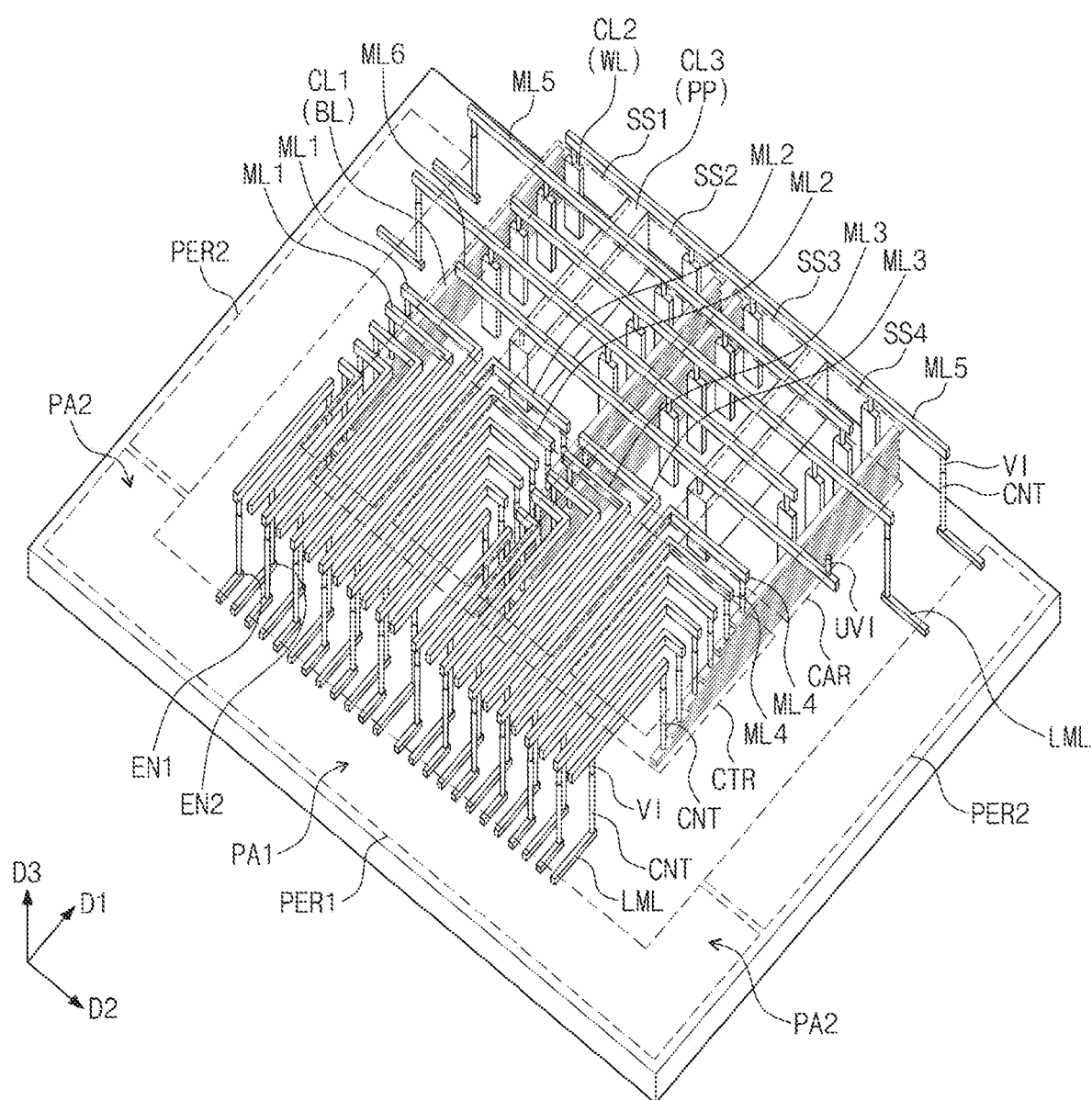
FIG. 14 is a perspective view illustrating a three-dimensional semiconductor memory device according to an embodiment of the inventive concept.

FIG. 14 is a perspective view illustrating a three-dimensional semiconductor memory device according to an embodiment of the inventive concept. Referring to FIG. 14, the first peripheral circuit region PER1 may include a first portion PA1, which extends in the second direction D2, and second portions PA2, which extend from the first portion PA1 in the first direction D1.

According to embodiments illustrated in FIGS. 13 and 14, it may be possible to secure a relatively large area for the first peripheral circuit region PER1, compared with an area of the first peripheral circuit region PER1 previously described with reference to FIG. 5.

Figure 15:
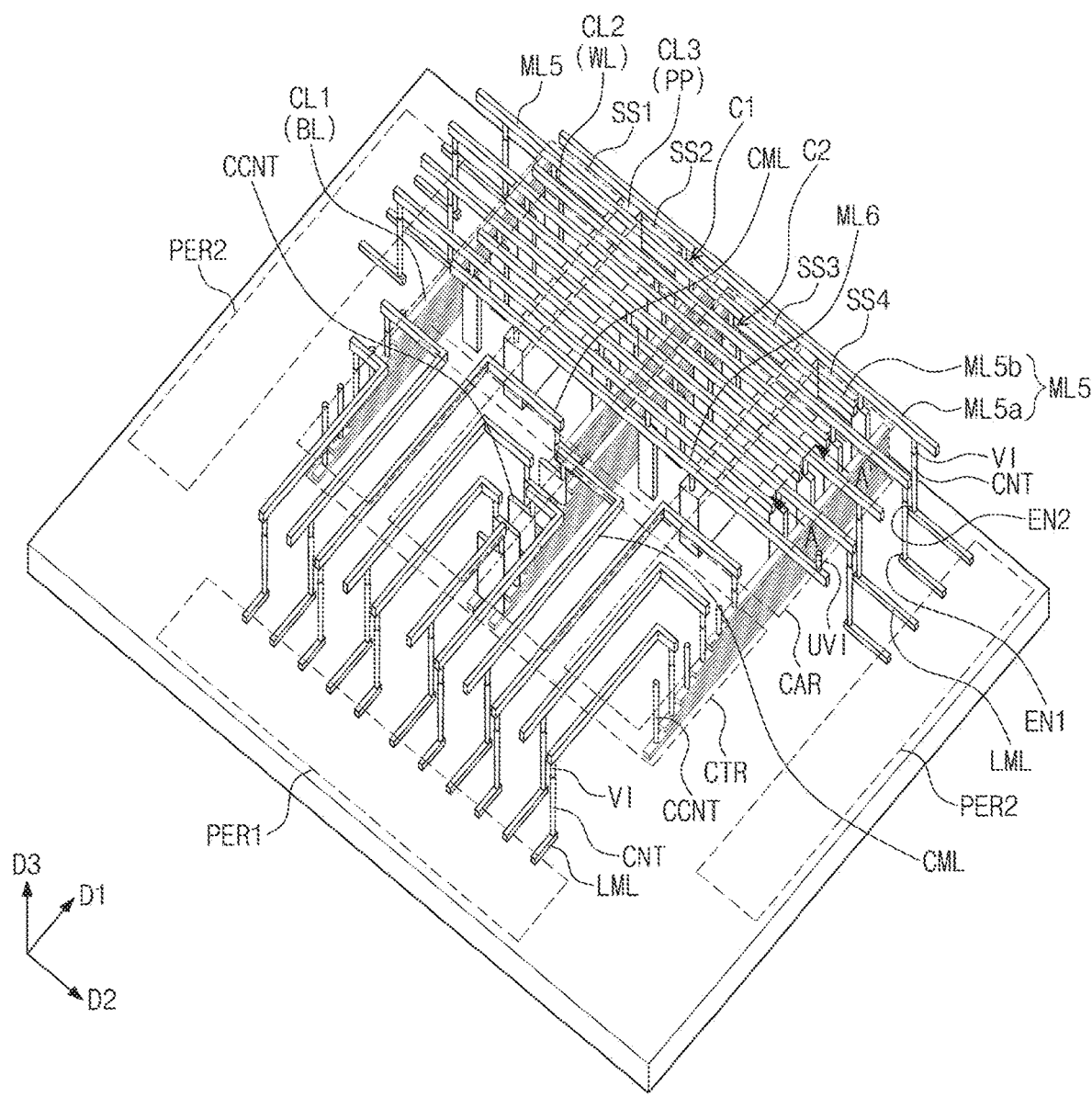
FIG. 15 is a perspective view illustrating a three-dimensional semiconductor memory device according to an embodiment of the inventive concept.
Figure 16:
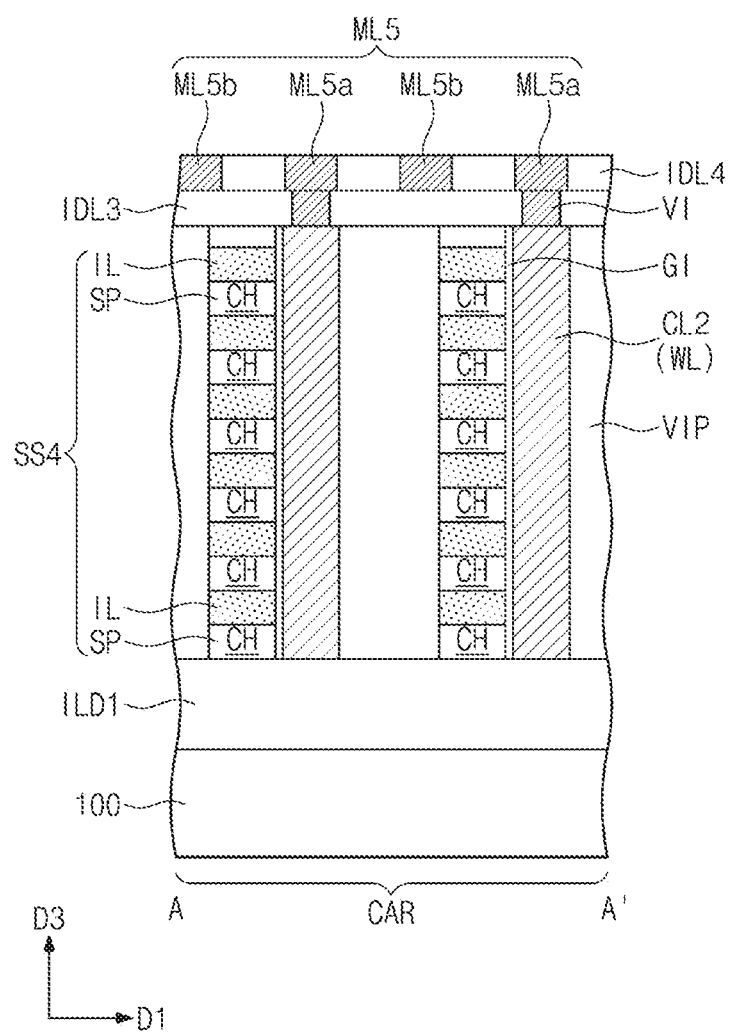
FIG. 16 is a cross-sectional view taken along a line A-A' of FIG. 15.

FIG. 15 is a perspective view illustrating a three-dimensional semiconductor memory device according to an embodiment of the inventive concept. FIG. 16 is a cross-sectional view taken along a line A-A' of FIG. 15. Referring to FIGS. 15 and 16, common contacts CCNT may be provided on the contact region CTR to be in contact with the first conductive lines CL1. Each of the common contacts CCNT may be in common contact with a pair of the first conductive lines CL1, which are positioned at the same level.

For example, the lowermost one of the first conductive lines CL1 of the second stack SS2 and the lowermost one of the first conductive line CL1 of the third stack SS3 may be connected in common to a corresponding one of the common contacts CCNT. The uppermost one of the first conductive line CL1 of the second stack SS2 and the uppermost one of the first conductive line CL1 of the third stack SS3 may be connected in common to a corresponding one of the common contacts CCNT.

Common interconnection lines CML may be provided instead of the first to fourth interconnection lines ML1-ML4 previously described with reference to FIG. 5. The common interconnection lines CML may be electrically connected to the common contacts CCNT through the vias VI. Each of the common interconnection lines CML may be electrically connected to a corresponding pair of the first conductive lines CL1, which are positioned at the same level, thorough a single common contact CCNT.

In some embodiments, although not shown, the common contact CCNT may be provided to be in common contact with the first conductive line CL1 of the first stack SS1 and the first conductive line CL1 of the second stack SS2. The common contact CCNT may be provided to be in common contact with the first conductive line CL1 of the third stack SS3 and the first conductive line CL1 of the fourth stack SS4.

The fifth interconnection lines ML5 may include first sub-interconnection lines ML5a and second sub-interconnection lines ML5b. The first sub-interconnection lines ML5a and the second sub-interconnection lines ML5b may be alternatingly arranged in the first direction D1. Each of the first sub-interconnection lines ML5a may be connected in common to the second conductive lines CL2 of the second and fourth stacks SS2 and SS4. Each of the first sub-interconnection lines ML5a may not be connected to the second conductive lines CL2 of the first and third stacks SS1 and SS3. Each of the second sub-interconnection lines ML5b may be connected in common to the second conductive lines CL2 of the first and third stacks SS1 and SS3. Each of the second sub-interconnection lines ML5b may not be connected to the second conductive lines CL2 of the second and fourth stacks SS2 and SS4.

As an example, the second conductive lines CL2 of the second stack SS2 may constitute a first column C1, the second conductive lines CL2 of the third stack SS3 may constitute a second column C2. The first one of the second conductive lines CL2 of the first column C1 may not be aligned with (i.e., may be offset from) the first one of the second conductive lines CL2 of the second column C2 in the second direction D2. The first one of the second conductive lines CL2 of the first column C1 may be electrically connected to the first sub-interconnection line ML5a, and the first one of the second conductive lines CL2 of the second column C2 may be electrically connected to the second sub-interconnection line ML5b. The second one of the second conductive lines CL2 of the first column C1 may not be aligned with (i.e., may be offset from) the second one of the second conductive lines CL2 of the second column C2 in the second direction D2. The second one of the second conductive lines CL2 of the first column C1 may be electrically connected to the first sub-interconnection line ML5a, and the second one of the second conductive lines CL2 of the second column C2 may be electrically connected to the second sub-interconnection line ML5b.

The first sub-interconnection lines ML5a may be extended from the cell region CAR onto the second peripheral circuit region PER2, which is located adjacent to a first side of the cell region CAR. The second sub-interconnection lines ML5b may be extended from the cell region CAR onto the second peripheral circuit region PER2, which is located adjacent to a second side of the cell region CAR, which is opposite the first side of the cell region CAR.

The contacts CNT, which are in contact with the lower interconnection lines LML on the second peripheral circuit region PER2 may be arranged to form a zigzag shape in the second direction D2. Since the contacts CNT are arranged in the zigzag shape on the second peripheral circuit region PER2, it may be possible to secure a sufficient process margin between adjacent ones of the contacts CNT. For example, the first one of the lower interconnection lines LML on the second peripheral circuit region PER2 may have a first end EN1. The second one of the lower interconnection lines LML on the second peripheral circuit region PER2 may have a second end EN2. The second end EN2 may be closer to the contact region CTR than the first end EN1.

Figure 17:
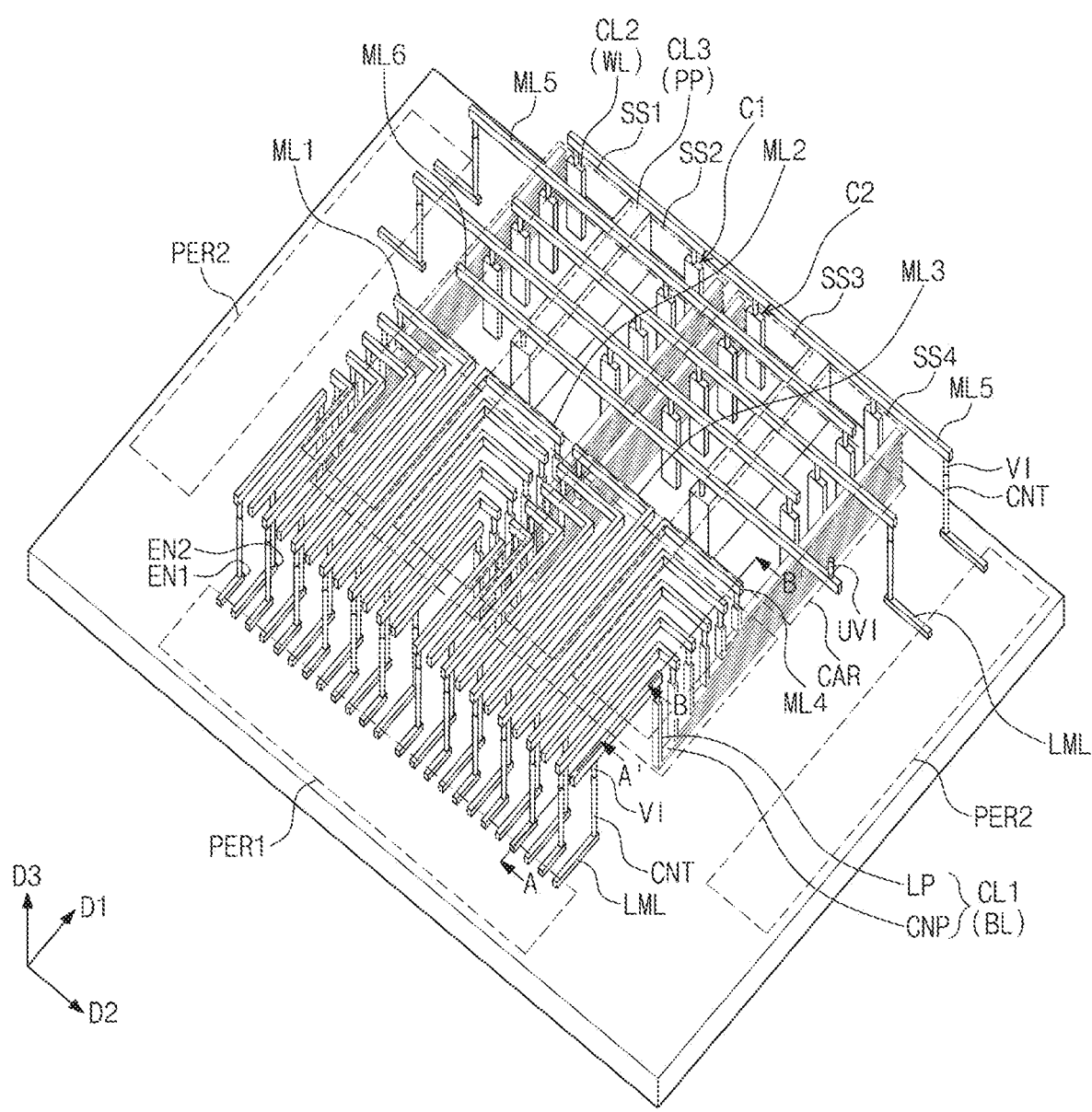
FIG. 17 is a perspective view illustrating a three-dimensional semiconductor memory device according to an embodiment of the inventive concept.
Figure 18:
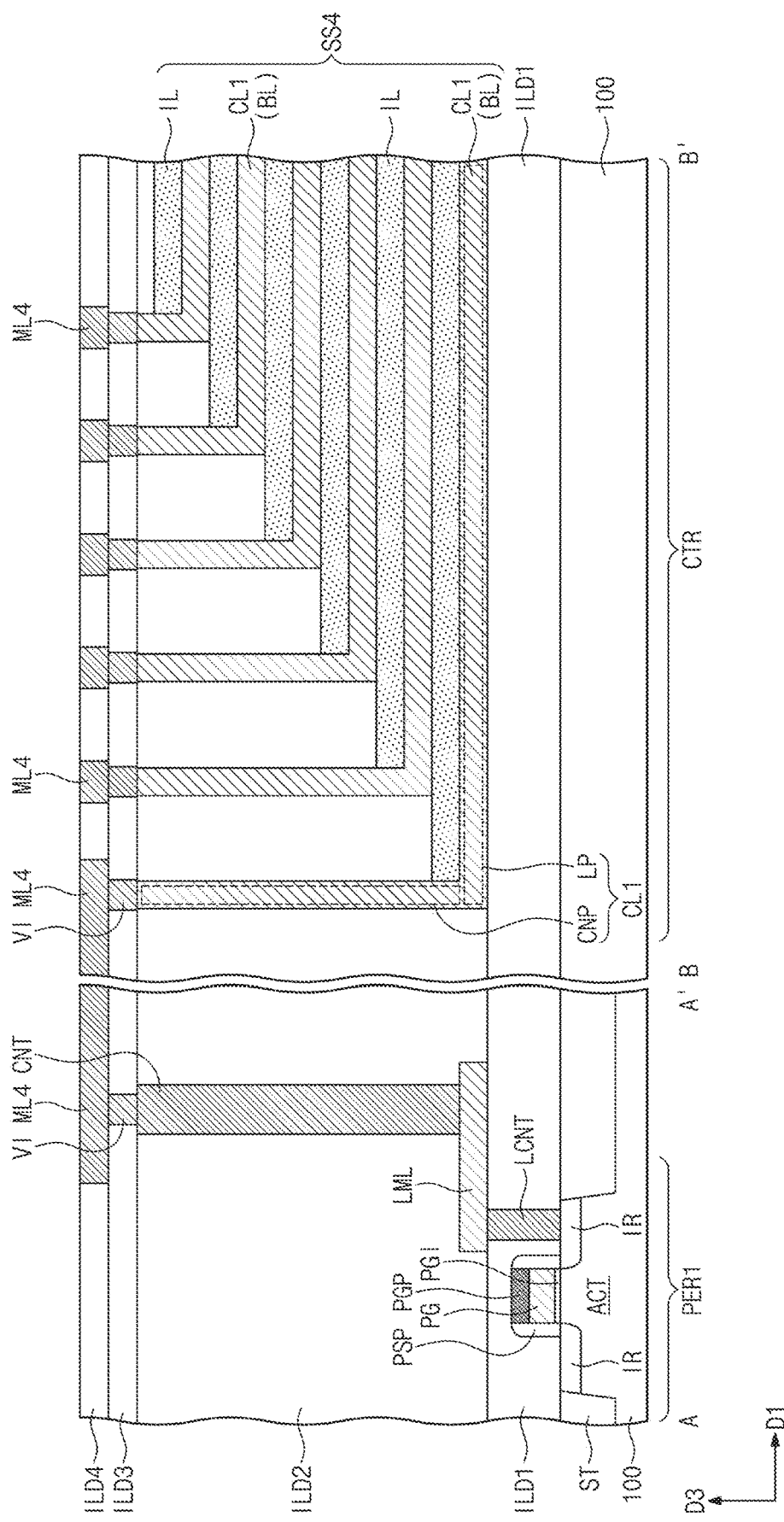
FIG. 18 is a cross-sectional view taken along lines A-A' and B-B' of FIG. 17.

FIG. 17 is a perspective view illustrating a three-dimensional semiconductor memory device according to an embodiment of the inventive concept. FIG. 18 is a cross-sectional view taken along lines A-A' and B-B' of FIG. 17. Referring to FIGS. 17 and 18, each of the first conductive lines CL1 may include an interconnection portion LP extending in the first direction D1 and a contact portion CNP extending from the interconnection portion LP in the third direction D3.

The contact portions CNP of the first conductive lines CL1 may be provided on the contact region CTR. The contact portions CNP of each of the first to fourth stacks SS1-SS4 may be arranged in the first direction D1. Top surfaces of the contact portions CNP may be substantially coplanar with the top surface of the second interlayered insulating layer ILD2. The vias VI may be provided on the top surfaces of the contact portions CNP. The contact portions CNP may be electrically connected to the first to fourth interconnection lines ML1-ML4 through the vias VI.

According to some embodiments of the inventive concept, a three-dimensional semiconductor memory device may include memory cells, which are three-dimensionally arranged on a substrate. Interconnection lines may be provided on the memory cells and may be used to efficiently connect bit lines and word lines to peripheral circuit regions.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device comprising:
a substrate including a cell region and a contact region;
a first stack and a second stack that are on the substrate; and
a first interconnection line and a second interconnection line that are on the first and second stacks,
wherein the first interconnection line extends in a first horizontal direction that is parallel to a top surface of the substrate,
wherein the second interconnection line extends in a second horizontal direction that crosses the first horizontal direction and is parallel to the top surface of the substrate,
wherein each of the first and second stacks comprises:
a plurality of memory cell transistors three-dimensionally arranged on the substrate;
a bit line connected to first ones of the plurality of memory cell transistors, the first ones of the plurality of memory cell transistors being spaced apart from each other in the first horizontal direction; and
a word line connected to second ones of the plurality of memory cell transistors, the second ones of the plurality of memory cell transistors being spaced apart from each other in a vertical direction that is perpendicular to the top surface of the substrate, and
wherein the bit line of the first stack comprises a first bit line, the bit line of the second stack comprises a second bit line, and wherein, on the contact region, the first interconnection line is electrically connected to at least one of the first and second bit lines, and
wherein the word line of the first stack comprises a first word line, the word line of the second stack comprises a second word line, and wherein, on the cell region, the second interconnection line is electrically connected to at least one of the first and second word lines.

2. The semiconductor memory device of claim 1, wherein the first and second bit lines extend in the first horizontal direction, and
wherein the first and second word lines extend in the vertical direction.

3. The semiconductor memory device of claim 1, wherein the first bit line and the second bit line are at an equal level.

4. The semiconductor memory device of claim 1, wherein the substrate further includes a first peripheral circuit region and a second peripheral circuit region,
wherein the first interconnection line extends from the contact region onto the first peripheral circuit region, and
wherein the second interconnection line extends from the cell region onto the second peripheral circuit region.

5. The semiconductor memory device of claim 1, wherein each of the first and second stacks further comprises a plurality of data storing elements connected to the plurality of memory cell transistors, respectively.

6. The semiconductor memory device of claim 5, wherein each of the plurality of data storing elements comprises a first electrode, a second electrode and a dielectric layer between the first and second electrodes.

7. The semiconductor memory device of claim 1, further comprising a third interconnection line on the first and second stacks,
wherein the first interconnection line is electrically connected to the first bit line,
wherein the third interconnection line is electrically connected to the second bit line, and
wherein the second interconnection line is electrically connected to both the first and second word lines.

8. The semiconductor memory device of claim 7, wherein the second interconnection line extends in the second horizontal direction, and
wherein the first and second word lines are spaced apart from each other in the second horizontal direction and are aligned in the second horizontal direction.

9. The semiconductor memory device of claim 1, further comprising a third interconnection line on the first and second stacks,
wherein the first interconnection line is electrically connected to both the first and second bit lines,
wherein the second interconnection line is electrically connected to the first word line, and
wherein the third interconnection line is electrically connected to the second word line.

10. The semiconductor memory device of claim 9, further comprising a common contact contacting both the first and second bit lines,
wherein the first interconnection line is electrically connected to both the first and second bit lines through the common contact.

11. The semiconductor memory device of claim 1, further comprising:
a first peripheral circuit region and a second peripheral circuit region that are on the substrate,
wherein the first and second stacks are positioned higher than the first and second peripheral circuit regions,
wherein the first interconnection line electrically connects the at least one of the first and second bit lines to the first peripheral circuit region, and
wherein the second interconnection line electrically connects the at least one of the first and second word lines to the second peripheral circuit region.

12. The semiconductor memory device of claim 11, wherein the first and second bit lines extend in the first horizontal direction, and
wherein the first and second word lines extend in the vertical direction.

13. The semiconductor memory device of claim 11, wherein each of the first and second stacks further comprises a plurality of data storing elements connected to the plurality of memory cell transistors, respectively.

14. The semiconductor memory device of claim 13, wherein each of the plurality of data storing elements comprises a first electrode, a second electrode and a dielectric layer between the first and second electrodes.

15. The semiconductor memory device of claim 11, further comprising:
a first contact electrically connects the first interconnection line to a first peripheral transistor of the first peripheral circuit region; and
a second contact electrically connects the second interconnection line to a second peripheral transistor of the second peripheral circuit region.

16. The semiconductor memory device of claim 1, further comprising:
a first peripheral transistor and a second peripheral transistor that are on the substrate; and
an interlayered insulating layer on the first and second peripheral transistors,
wherein the interlayered insulating layer is between the substrate and the first and second stacks,
wherein the first interconnection line electrically connects the at least one of the first and second bit lines to the first peripheral transistor, and
wherein the second interconnection line electrically connects the at least one of the first and second word lines to the second peripheral transistor.

17. The semiconductor memory device of claim 16, wherein the first and second bit lines extend in the first horizontal direction, and
wherein the first and second word lines extend in the vertical direction.

18. The semiconductor memory device of claim 16, wherein each of the first and second stacks further comprises a plurality of data storing elements connected to the plurality of memory cell transistors, respectively.

19. The semiconductor memory device of claim 18, wherein each of the plurality of data storing elements comprises a first electrode, a second electrode and a dielectric layer between the first and second electrodes.

20. The semiconductor memory device of claim 16, further comprising a first contact extends through the interlayered insulating layer and electrically connects the first interconnection line to the first peripheral transistor; and
a second contact extends through the interlayered insulating layer and electrically connects the second interconnection line to the second peripheral transistor.

* * * * *